(12) United States Patent
Stanbery

(10) Patent No.: US 8,084,685 B2
(45) Date of Patent: Dec. 27, 2011

(54) APPARATUS FOR MAKING CONTROLLED SEGREGATED PHASE DOMAIN STRUCTURES

(75) Inventor: Billy J. Stanbery, Austin, TX (US)

(73) Assignee: HelioVolt Corporation, Austin, TX (US)

( * ) Notice: Subject to any disclaimer, the term of this patent is extended or adjusted under 35 U.S.C. 154(b) by 1446 days.

(21) Appl. No.: 11/331,431

(22) Filed: Jan. 12, 2006

(65) Prior Publication Data

US 2007/0160770 A1    Jul. 12, 2007

(51) Int. Cl.
*H01L 31/052* (2006.01)
(52) U.S. Cl. .......... 136/263; 136/255; 136/252; 438/61; 438/62; 438/66; 438/82
(58) Field of Classification Search .......... None
See application file for complete search history.

(56) References Cited

U.S. PATENT DOCUMENTS

| | | | |
|---|---|---|---|
| 3,629,036 A | 12/1971 | Isaacson | |
| 4,088,544 A | 5/1978 | Hutkin | |
| 4,267,398 A | 5/1981 | Rothwarf | |
| 4,315,097 A | 2/1982 | Solomon | |
| 4,322,571 A | 3/1982 | Stanbery | |
| 4,392,451 A | 7/1983 | Mickelsen et al. | |
| 4,479,847 A | 10/1984 | McCaldin et al. | |
| 4,523,051 A | 6/1985 | Mickelsen et al. | |
| RE31,968 E | 8/1985 | Mickelsen et al. | |
| 4,571,448 A | 2/1986 | Barnett | |
| 4,609,820 A | 9/1986 | Miyamoto | |
| 4,611,091 A | 9/1986 | Choudary et al. | |
| 4,674,434 A | 6/1987 | Ishihara | |
| 4,823,176 A | 4/1989 | Baliga et al. | |
| 4,864,599 A | 9/1989 | Saegusa et al. | |
| 4,902,395 A | 2/1990 | Yoshimura | |
| 4,902,398 A | 2/1990 | Homstad | |
| 4,902,668 A | 2/1990 | Whitcomb et al. | |
| 5,028,274 A | 7/1991 | Basol et al. | |
| 5,055,150 A * | 10/1991 | Rosenfeld et al. | 156/150 |
| 5,124,308 A | 6/1992 | Albin et al. | |
| 5,178,967 A * | 1/1993 | Rosenfeld et al. | 428/697 |
| 5,248,621 A | 9/1993 | Sano | |
| 5,298,449 A | 3/1994 | Kikuchi | |
| 5,396,839 A | 3/1995 | Rice | |

(Continued)

FOREIGN PATENT DOCUMENTS

DE    4225385    7/1992

(Continued)

OTHER PUBLICATIONS

Cyganik et al., Substructure Formation During Pattern Transposition from Substrate into Polymer Blend Film, Europhysics Letters, vol. 62 No. 6, p. 855, 2003.*

(Continued)

*Primary Examiner* — Jennifer Michener
*Assistant Examiner* — Jayne Mershon
(74) *Attorney, Agent, or Firm* — John Bruckner PC

(57) ABSTRACT

An apparatus includes a first substrate; and a second substrate coupled to the first substrate, characterized in that, to control formation of a segregated phase domain structure within a chemical reaction product by controlling an amount of a constituent of a precursor that is present per unit surface area, at least one member selected from the group consisting of the first substrate and the second substrate defines a substantially regularly periodically varying relief with respect to basal spatial location.

5 Claims, 14 Drawing Sheets

U.S. PATENT DOCUMENTS

| | | | |
|---|---|---|---|
| 5,405,802 | A | 4/1995 | Yamagata et al. |
| 5,436,204 | A | 7/1995 | Albin et al. |
| 5,441,897 | A | 8/1995 | Noufi et al. |
| 5,477,088 | A | 12/1995 | Rockett et al. |
| 5,477,288 | A | 12/1995 | Miyazaki et al. |
| 5,567,469 | A | 10/1996 | Wada et al. |
| 5,578,503 | A | 11/1996 | Karg et al. |
| 5,626,688 | A | 5/1997 | Probst et al. |
| 5,674,555 | A | 10/1997 | Birkmire et al. |
| 5,687,218 | A | 11/1997 | Nakayama |
| 5,705,011 | A | 1/1998 | Bodford et al. |
| 5,730,852 | A | 3/1998 | Bhattacharya et al. |
| 5,756,240 | A | 5/1998 | Roberts et al. |
| 5,759,954 | A | 6/1998 | Taguchi et al. |
| 5,794,163 | A | 8/1998 | Paterson et al. |
| 5,846,638 | A | 12/1998 | Meissner |
| 5,858,121 | A | 1/1999 | Wada et al. |
| 5,858,628 | A | 1/1999 | Yoshida et al. |
| 5,948,176 | A | 9/1999 | Ramanathan et al. |
| 6,021,207 | A | 2/2000 | Puthuff et al. |
| 6,026,082 | A | 2/2000 | Astrin |
| 6,072,818 | A | 6/2000 | Hayakawa |
| 6,100,165 | A | 8/2000 | Sakaguchi et al. |
| 6,121,541 | A | 9/2000 | Arya |
| 6,141,356 | A | 10/2000 | Gorman |
| 6,146,979 | A | 11/2000 | Henley et al. |
| 6,185,418 | B1 | 2/2001 | MacLellan et al. |
| 6,187,653 | B1 | 2/2001 | Hui et al. |
| 6,190,453 | B1 | 2/2001 | Boydston et al. |
| 6,225,190 | B1 | 5/2001 | Bruel et al. |
| 6,225,199 | B1 | 5/2001 | Han et al. |
| 6,251,754 | B1 | 6/2001 | Ohshima et al. |
| 6,313,479 | B1 | 11/2001 | Zhang et al. |
| 6,323,417 | B1 | 11/2001 | Gillespie et al. |
| 6,339,695 | B1 | 1/2002 | Clark |
| 6,372,538 | B1 | 4/2002 | Wendt et al. |
| 6,399,486 | B1 | 6/2002 | Chen et al. |
| 6,455,398 | B1 | 9/2002 | Fonstad, Jr. et al. |
| 6,475,354 | B1 | 11/2002 | Toyama |
| 6,500,733 | B1 | 12/2002 | Stanbery |
| 6,521,511 | B1 | 2/2003 | Inoue et al. |
| 6,559,372 | B2 | 5/2003 | Stanbery |
| 6,593,213 | B2 | 7/2003 | Stanbery |
| 6,669,830 | B1 | 12/2003 | Inoue et al. |
| 6,720,239 | B2 | 4/2004 | Stanbery |
| 6,736,986 | B2 | 5/2004 | Stanbery |
| 6,787,012 | B2 * | 9/2004 | Stanbery .................. 204/298.24 |
| 6,797,874 | B2 | 9/2004 | Stanbery |
| 6,852,920 | B2 | 2/2005 | Sager et al. |
| 6,855,202 | B2 | 2/2005 | Alivisatos et al. |
| 6,881,647 | B2 | 4/2005 | Stanbery |
| 6,936,761 | B2 | 8/2005 | Pichler |
| 6,987,071 | B1 | 1/2006 | Bollman et al. |
| 7,045,205 | B1 | 5/2006 | Sager |
| 7,097,902 | B2 | 8/2006 | Blanton et al. |
| 7,422,696 | B2 | 9/2008 | Mirkin et al. |
| 2002/0006470 | A1 | 1/2002 | Eberspacher et al. |
| 2002/0016188 | A1 | 2/2002 | Kashiwamura |
| 2002/0043279 | A1 | 4/2002 | Karg |
| 2003/0051664 | A1 | 3/2003 | Stanbery |
| 2003/0052391 | A1 | 3/2003 | Stanbery |
| 2003/0054582 | A1 | 3/2003 | Stanbery |
| 2003/0054662 | A1 | 3/2003 | Stanbery |
| 2003/0054663 | A1 | 3/2003 | Stanbery |
| 2003/0123167 | A1 | 7/2003 | Kolberg et al. |
| 2003/0201010 | A1 | 10/2003 | Koyanagi et al. |
| 2004/0063320 | A1 | 4/2004 | Hollars |
| 2004/0250848 | A1 | 12/2004 | Sager et al. |
| 2005/0095422 | A1 | 5/2005 | Sager et al. |
| 2005/0098204 | A1 | 5/2005 | Roscheisen et al. |
| 2005/0098205 | A1 | 5/2005 | Roscheisen et al. |
| 2005/0109392 | A1 | 5/2005 | Hollars |
| 2005/0121068 | A1 | 6/2005 | Sager et al. |
| 2005/0183767 | A1 | 8/2005 | Yu et al. |
| 2005/0183768 | A1 | 8/2005 | Roscheisen et al. |
| 2005/0186342 | A1 | 8/2005 | Sager et al. |
| 2005/0218377 | A1 | 10/2005 | Lawandy |
| 2006/0062902 | A1 | 3/2006 | Sager et al. |
| 2007/0077429 | A1 | 4/2007 | Mirkin et al. |
| 2007/0119522 | A1 | 5/2007 | Grier et al. |
| 2007/0152236 | A1 | 7/2007 | Halpert et al. |
| 2007/0163642 | A1 | 7/2007 | Van Duren et al. |

FOREIGN PATENT DOCUMENTS

| | | |
|---|---|---|
| DE | 42 25 385 | 2/1994 |
| DE | 4225385 | 2/1994 |
| EP | 0381509 | 2/1990 |
| EP | 0 381 509 | 8/1990 |
| EP | 381509 | 8/1990 |
| EP | 0621130 | 4/1994 |
| EP | 0 621 130 | 10/1994 |
| EP | 0661760 | 12/1994 |
| EP | 0 661 760 | 7/1995 |
| EP | 61760 | 7/1995 |
| EP | 0763859 | 9/1996 |
| EP | 0 763 859 | 3/1997 |
| EP | 0763859 | 3/1997 |
| EP | 763859 | 3/1997 |
| EP | 621130 | 11/1997 |
| EP | 0989593 | 9/1999 |
| EP | 0 989 593 | 3/2000 |
| EP | 989593 | 3/2000 |
| WO | WO 97/22152 | 6/1997 |
| WO | WO97/22152 | 6/1997 |
| WO | WO00/33363 | 6/2000 |
| WO | WO 00/33363 | 6/2000 |
| WO | WO 03/002225 | 1/2003 |
| WO | WO 03/026022 | 3/2003 |
| WO | WO03/026022 | 3/2003 |
| WO | WO 03/026023 | 3/2003 |
| WO | WO 03/026024 | 3/2003 |
| WO | WO 03/026025 | 3/2003 |
| WO | WO 03/026026 | 3/2003 |
| WO | WO 03/026028 | 3/2003 |
| WO | WO2005/017978 | 2/2005 |
| WO | WO 2005/059952 | 6/2005 |
| WO | WO2006041199 | 4/2006 |
| WO | WO 2006/133129 | 12/2006 |
| WO | WO 2007/082080 | 7/2007 |
| WO | WO 2007/082084 | 7/2007 |
| WO | WO 2007/082085 | 7/2007 |
| WO | WO 2008/027571 | 3/2008 |

OTHER PUBLICATIONS

International Search Reported for PCT/US02/29529 mailed Sep. 17, 2003.

International Search Reported for PCT/US02/29608 mailed Sep. 23, 2003.

International Search Reported for PCT/US02/29684 mailed Sep. 16, 2003.

International Search Reported for PCT/US02/29607 mailed Sep. 17, 2003.

International Search Reported for PCT/US02/29605 mailed Sep. 23, 2003.

International Search Reported for PCT/US02/29684 mailed Sep. 23, 2003.

Chen et al. "Thin Film CuInGaSe$_2$ Cell Development," 0-7803-1220-1/93 IEEE (1993), pp. 422-425.

Li et al. "Effects of buffer layer processing on CIGS excess carrier lifetime: application of dual-beam optical modulation to process analysis," 0-7803-3166-4/96 IEEE 25$^{th}$ PVSV (May 13-17, 1996) Washington, D.C., pp. 821-824.

Tuttle et al. "A 15.2% AM0/1433 W/KG Thin-film Cu(In,Ga)Se$_2$ solar cell for space applications," 0-7803-5772-8/00 IEEE (2000), pp. 1042-1045.

Noufi et al. "Chemical-fluctuation-induced nanodomains in Cu(In,Ga)Se$_2$ films," 20th European Photovoltaic Solar Energy Conference, Jun. 6-10, 2005, Barcelona, Spain, pp. 1744-1747.

B.J. Stanbery, "The intra-absorber junction (IAJ) model for the device physics of copper indium selenide-based photovoltaics," 0-7803-8707-4/05 IEEE, presented Jan. 5, 2005, pp. 355-358.

Y. Yan, R. Noufi, K.M. Jones, K. Ramanathan, M.M. Al-Jassim and B.J. Stanbery, "Chemical fluctuation-induced nanodomains in Cu(In,Ga)Se$_2$ films," Applied Physics Letters 87, 121904 American Institute of Physics, Sep. 12, 2005.

Billy J. Stanbery, "Copper indium selenides and related materials for photovoltaic devices," 1040-8436/02 CRC Press, Inc., 2002, pp. 73-117.

Probst et al. "Rapid CIS-process for high efficiency PV-modules: development towards large area processing," Thin Solid Films 387 (2001) pp. 262-267.

International search report PCT/US02/29529, date of mailing of the international search report—Sep. 17, 2003.

International search report PCT/US02/29608, date of mailing of the international search report—Sep. 23, 2003.

International search report PCT/US02/29684, date of mailing of the international search report—Sep. 16, 2003.

International search report PCT/US02/29607, date of mailing of the international search report—Sep. 17, 2003.

International search report PCT/US02/29605, date of mailing of the international search report—Sep. 23, 2003.

International search report PCT/US02/29701, date of mailing of the international search report—Sep. 23, 2003.

Novel single-molecule precursor routes for the direct synthesis of InS and InSe quantum dots—Revaprasadu, et al.; J. Mater. Chem., 1999, 9, 2885-2888.

Catalyzed Growth of a Metastable InS Crystal Structure as Collidial Crystals—Hollingsworth, et al.; J. Am. Chem. Soc. 2000,122, 3562-3563.

The Spectroscopy of InSe Nanoparticles—Yang, et al.; J. Phys. Chem. B 2005,109, 12701-12709.

Five-fold Symmetry in Crystalline Quasicrystal Lattices—Caspar, et al.,;Proc. Nat. Acad. Sci. USA, vol. 93, pp. 14271-14278, Dec. 1996.

Epitaxial Growth of Highly Luminescent CdSe/CdS Core/Shell Nanocrystals with Photostability and Electronic Accessibility—Peng, et al.; J. Am. Chem. Soc. 1997, 7019-7029.

Elemental Solvothermal Reaction to Produce Ternary Semiconductor CuInE$_2$ (E=S, Se) Nanorods—Jiang, et al.; Inorg. Chem. 2000, 39, 2964-2965.

Collidial Nanocrystal Synthesis and the Organic-inorganic Interface—Yin, et al.; Nature, vol. 437, Sep. 29, 2005.

The Effect of Organic Ligand Binding on the Growth of CdSe Nanoparticles Probed by Ab Initio Calculations—Puzder, et al.; Nano Letters 2004, vol. 4, No. 12, 2361-2365.

First-Principles Modeling of Unpassivated and Surfactant-Passivated Bulk Facets of Wurtzite CdSe: A Model System for Studying the Anisotropic Growth of CdSe Nanocrystals—Manna, et al.; J. Phys. Chem. B 2005, 109, 6183-6192.

Electroluminescent Properties of Device Based on ZnS;Tb/CdS Core-shell Nanocrystals—Hua, et al.; Chemical Physics Letters 419 (2006) 269-272.

Synthesis and Characterization of Monodisperse Nanocrystals and Close-packed Nanopcrystal Assemblies—Murray, et al.; Annu. Rev. Mater. Sci. 2000, 30: 545-610.

Synthesis of CuInGaSe2 nanoparticles by solvothermal route—Chun, et al.; Thin Solid Films 480-481 (2005), 46-49.

Synthesis by a Solvothermal Route and Characterization of CuInSe$_2$ Nanowhiskers and Nanowhiskers—Li, et al.; Adv. Mater. 1999, 11, No. 17.

Microwave-assisted Polyol Synthesis of CuInTe$_2$ and CuInSe$_2$ Nanoparticles—Grisaru, et al.; Inorg. Chem. 2003, 42, 7148-7155.

Sonochemical Process for the Preparation of α-CuSe Nanocrystals and Flakes—Li, et al.; J. Mater. Chem., 2002, 12, 3723-3727.

Sonochemical Synthesis of Copper Selenides Nanocrystals with Different Pahses—Xu, et al.; Journal of Crystal Growth 234 (2002), 263-266.

Shape Control of II-VI Semiconductor Nanomaterials—Kumar, et al.; small 2006, 2, No. 3, 316-329.

Chemistry and Properties of Nanocrystals of Different Shapes—Burda, et al.; Chem. Rev. 2005, 105, 1025-1102.

International search report PCT/US07/000940, date of mailing of the international search report—Jul. 24, 2008.

International search report PCT/US07/000941, date of mailing of the international search report—Jul. 24, 2008.

International search report PCT/US07/000935, date of mailing of the international search report—Jul. 24, 2008.

Cyganik et al. (Substructure Formation during Pattern Transposition from Substrate into Polymer Blend Film), Europhysics Letters, vol. 62, No. 6, Apr. 29, 2003.

Hiraga et al., "Formation of Decagonal Quasicrystal in the Al-Pd-Mn System and its Structure"; Japanese Journal of Applied Physics, vol. 30, No. 9A, pp. 2028-2034, Sep. 1991.

Park et al., Phase-controlled One-Dimensional Shape Evolution of InSe Nanocrystals; J.Am. Chem. Soc., 2006, 128, 14780-14781.

Pinna et al., "Triangular CDS nanocrystals: Structural and Optical Studies", Advanced materials, Wiley Vch, Weiheim, DE, vol. 13, No. 4, Feb. 19, 2001, pp. 261-264.

Probst et al., "The Impact of Controlled Sodium Incorporation on Rapid Thermal Processed Du(InGa)Se.sub.2—Thin Films and Devices," First WCPEC; Dec. 5-9, 1994; Hawaii; CH3365-4/94/0000-0144 IEEE, pp. 144-147.

Characteristics of Indium Phosphide Solar Cells Bonded on Silicon—Lammasniemi, et al.; Tampere University of Technology, Tampere, Finland.1993.

XPS Studies of Sodium Compound Formation and Surface Segregation in CIGs Thin Films—Stanbery, et al.; $26^{th}$ PVSC, Sep. 30-Oct. 3, 1997.

Evolution of the Phases and Chemical Composition During the Formation of CIS Thin Films prepared by Interdiffusion Process in Selenides Layers—Trhsriian, et al., Journals of Crystal Growth 183 (1998).

Role of Sodium of the Control of Defect Structures in CIS—Stanbery, et al.; $28^{th}$ IEEE PCSC Anchorage, AK, 2000.

Effects of Buffer Layer Processing on CIGs Excess Carrier Lifetime: Application of Dual-beam Optical Modulation to Process—Sheng, et al.; $25^{TH}$ PVSC; May 16-17, 1996.

Presentation and Characterization of CiInSe$_2$ Films for PV Applications by Low Pressure Vapor Phase Selenization—Nakada, et al.; $11^{th}$ E.C. Photovoltaic Solar Energy Conference Oct. 12-16, 1992 Montreux, Switzerland.

Rapid CIS Process for High Efficiency PV-Modules: Development Towards Large-area Processing; Thin Solid Films 387 (2001) 262-267.

Thin Film Photovoltaics—Schock; Applied Surface Science 92 (1996) 606-616.

Advanced Stack Elemental Layer Process for Cu(InGa)Se$_2$ Thin Film Photovoltaic Devices—Probst, et al.; Mat. Res. Soc. Symp. Proc. vol. 426, 1196 Materials Research Society, 1996.

A 15.2% AM0 / 1433 w/kg Thin Film Cu(In,Ga)Se$_2$ Solar Cell for Space Applications—Tuttle, et al.; 2000.

Influence of Sodium on the Growth of Polycrystalline Cu(In,Ga)Se$_2$ Thin Films—Brauger, et al.; Thin Solid Films 361-362 (2000) 161-166.

Room Temperature Tailoring of Electrical Properties of Ternary and Multinary Chalcogenide Semiconductors—Cahen, et al.; Jpn. J. Appl. Phys. vol. 32 (1993) Suppl. 32-3, pp. 660-661.

Novel Multiplayer Process for CuInSe$_2$ Thin Film Formation by Rapid Thermal Processing—Chang, et al.; Mat. Res. Soc. Symp. Proc. vol. 485, 1998 Materials Research Society.

Thin Film CuInGaSe$_2$ Cell Development, Chen, et al.,1993.

Progress Toward 20% Efficacy in Cu(In,Ga)Se$_2$ Polycrystalline Thin-film Solar Cells—Contreras, et al.; Prog. Photovolt Res. Appl. 7, 311-316 (1999).

Non-vacuum Techniques for Fabricating Thin-film CIGs—Eberspacher, et al., 2000.

Reaction Pathways to CuInSe$_2$ Formation from Electrodeposited Precursors—Guillen, et al.; J. Electrochem. Soc., vol. 142, No. 6, Jun. 1995.

Field-assisted Bonding Below 200 degrees C Using Metal and Glass Thin-film Interlayers—Lee, et al.; Appl. Phys. Lett. , vol. 50, No. 9, Mar. 2, 1987.

Influence of Na on the Electro-optical Properties of Cu(InGa)Se$_2$—Keyes, et al.; NREL/CP-530-22963, UC Category: 1250, 1997.

Evaluation and Characterization of Polycrystalline CuInSe$_2$ Thin Films Prepared by the Sandwich Structure Technique—Hassan, et al.; 0268-1242/94 061255+06, 1994.

Direct Cover Glass Bonding to GaAs and GaAs/Ge Solar Cells—Nowlan, et al.; CH2953-8/91/0000-1480, 1991 IEEE.

Thin-film CuInSe$_2$/CdS Heterojunction Solar Cells—Kazmerski, et al.; Applied Business Letters, vol. 29, No. 4, Aug. 15, 1976.

The Intra-absorber Junction (IAJ) Model for the Device Physics of Copper Indium Selenide-based Photovoltaics—Stanbery; 0-7803-8707-4/05, 2005.

Anderson, et al, "Processing of CuInSe$_2$-Based Solar Cells: Characterization of Deposition Processes in Terms of Chemical Reaction Analyses" Final Report, May 6, 1995-Dec. 31, 1998, National Renewable Energy Laboratory, pp. 1-400, Jun. 2001.

Arya, et al, "Solar Cells and Submodules on CIS Prepared by EDCF Method" Solarex Corporation, Thin-Film Division, presented at the 23rd IEEE Photovoltaic Specialists Conference, pp. 1-4, May 1993.

Cahen, et al, "Room Temperature Tailoring of Electrical Properties of Ternary and Multinary Chalcogenide Semiconductors" Proc. 9th Int. Conf. Ternary and Multinary Compounds, Yokohama, pp. 1-2, Jun. 7, 1993.

Chang, et al, "Novel Multilayer Process for CuInSe$_2$ Thin Film Formation by Rapid Thermal Processing", Material Res. Society Symposium Proceedings, vol. 485, pp. 163-168, 1998.

Contreras, et al, "Progress Toward 20% Efficiency in Cu(In, Ga)Se$_2$ Polycrystalline Thin-film Solar Cells," Progress in Photovoltaics Research and Applications, Short Communication: Accelerated Publication, pp. 311-316, Mar. 26, 1999.

Eberspacher, et al, "Non-Vacuum Techniques for Fabricating Thin-Film CIGS", IEEE, pp. 517-520, 2000.

Gullen, et al, "Reaction Pathways to CuInSe$_2$ Formation from Electrodeposited Precursors" J. Electrochem. Soc. vol. 142, No. 6, pp. 1834-1838, Jun. 1995.

Hassan, et al, "Evaluation and characterization of polycrystalline CuInSe$_2$ thin films prepared by the sandwich structure technique" Semiconductor Science Technology, vol. 9, pp. 1255-1260, 1994.

Kazmerski, et al, "Thin-film CuInSe$_2$/CdS heterojunction solar cells" Applied Physics Letters, vol. 29, No. 4, pp. 268-270, Aug. 1976.

Nakada, et al, "Preparation and Characterization of CuInSe$_2$ Films for PV Applications by Low Pressure Vapor Phase Selenization," Proceedings of the 11th E.C. Photovoltaic Solar Energy Conference, pp. 794-797, Oct. 12-16, 1992.

Probst et al, "Advanced Stacked Elemental Layer Process for Cu(InGa)Se$_2$ Thin Film Photovoltaic Devices," Mat. Res. Soc. Symp. Proc., vol. 426, pp. 165-176, 1996.

Schock, "Thin film protovoltaics," Applied Surface Science, vol. 92, pp. 606-616, 1996.

Teheran, et al, "Evolution of the phases and chemical composition during the formation of CIS thin films prepared by interdiffusion process in selenides layers" Journal of Crystal Growth, vol. 183, pp. 352-360, 1998.

W. Y. Lee, F. Sequeda, S. J., and D. Chapman, "Field-assisted bonding below 200° C using metal and glass thin-film interlayers," *Applied Physics Letters*, vol. 50, pp. 522-524, 1987.

Stanbery, et al. XPS Studies of sodium compound formation and surface segregation in CIGS thin films: Conference record of the 26th IEEE Photovoltaic Specialists Conf., Oct. 3, 1997, pp. 499-502.

Braunger, et al. "Influence of sodium on the growth of polycrystalline Cu(In,Ga)Se2 thin films" Thin Solid Films, Elsevier-Sequoia S. A. Lausanne, Ch. vol. 361-362, Nr. 1, pp. 161-166, 2000.

Stanbery, et al. "Role of sodium in the control of defect structures in CIS solar cells" Conference record of the 26th IEEE Photovoltaic Specialists Conf., Sep. 15-22, 2000, pp. 440-445.

Lammasniemi, et al. "Characteristics of Indium Phosphide Solar Cells Bonded in Silicon" Proceedings of the Photovoltaic Specialists Conference, May 10-14, 1993, New York, IEEE, vol. Conf. 23, pp. 763-767.

Nowlan, et al. "Direct Cover Glass Bonding to GaAs and GaAs/Ge Solar cells" Proceedings of the Photovoltaic Specialists Conference, Law Vegas, Oct. 7-11, 1991, pp. 1480-1484.

\* cited by examiner

APPARATUS FOR MAKING CONTROLLED SEGREGATED PHASE DOMAIN STRUCTURES

BACKGROUND INFORMATION

1. Field of the Invention

Embodiments of the invention relate generally to the field of materials. More particularly, embodiments of the invention relate to methods of controlling formation of a segregated phase domain structure within a chemical reaction product, compositions of matter including such a segregated phase domain structure, and machinery having a complex tool relief for making such compositions.

2. Discussion of the Related Art

Prior art copper indium selenide based photovoltaics, sometimes called CIS based PV, are known to those skilled in the art of solar cells. CuInSe is the most reliable and best-performing thin film material for generating electricity from sunlight. A concern with this technology is that raw material supply constraints are going to arise in the future as the production of CIS PV increases. For instance, indium does not occur naturally in high concentration ores. Typically, indium is obtained from the discarded tailings of zinc ores. As the production of CIS PV approaches the large scale range of from approximately 10 gigawatts/year to approximately 100 gigawatts/year, indium supply constraints will become manifest. These supply constraints will lead to increased costs. Further, as the production of CIS PV increases, other raw material supply constraints will also emerge. What is required is a solution that reduces the amount of raw materials needed per watt of generating capacity in CIS PV thin films.

One approach to reducing the amount of raw materials needed is to reduce the thickness of the CIS PV thin film material. The inherent absorption coefficient of CIS is very high (i.e., approximately $10^5$ cm$^{-1}$). This means that most of the incident light energy can be absorbed with a very thin film of CIS. The use of a back surface reflector can further reduce the thickness necessary to absorb most of the incident light energy. While prior art CIS PV products are typically at least about 2 microns thick, it is important to appreciate that 0.25 microns is theoretically sufficient for a CIS PV thin film located on a back surface reflector to absorb most the incident light energy. What is also required is a solution that produces thinner CIS PV thin films.

Meanwhile, field assisted simultaneous synthesis and transfer technology has been developed that is directly applicable to the manufacture of thinner CIS PV films. Various aspects of this field assisted simultaneous synthesis and transfer technology (which aspects may or may not be used together in combination) are described in U.S. Pat. Nos. 6,736,986; 6,881,647; 6,787,012; 6,559,372; 6,500,733; 6,797,874; 6,720,239; and 6,593,213.

An advantage of field assisted simultaneous synthesis and transfer technology is that it works better as the precursor stack becomes thinner. For instance, the vapor pressure of selenium in a CIS based reaction product layer is a function of temperature. The pressure needed to contain the selenium is a function of the temperature required for the process reaction. It is important to appreciate that the voltage, if utilized, to achieve a desired pressure goes down as the thickness goes down. As the required voltage is reduced, the physical demands on the system (e.g., stress on the dielectric) go down. Therefore, as the precursor stack is made thinner, the voltage needed to generate a given pressure goes down; which reduces stress on the dielectric (for instance a release layer), thereby expanding the scope of materials that can be utilized as a dielectric.

Another advantage of field assisted simultaneous synthesis and transfer technology is that it enables a lower thermal budget. The lower thermal budget is a result of higher speed of the field assisted simultaneous synthesis and transfer technology compared to alternative approaches such as (physical or chemical) vapor deposition. In addition to the time and energy savings provided by the field assisted simultaneous synthesis and transfer technology, the quality of the resulting products can also be improved. For instance, in the case of manufacturing CIS based PV, the lower thermal budget enabled by the use of field assisted simultaneous synthesis and transfer technology leads to the reduction of undesirable reactions, such as between selenium and molybdenum at the interface between the CIS absorber and the back side metal contact. The reduction of this undesirable reaction results in reduced tarnishing which in-turn results in higher back surface reflectivity.

Recently, it has been demonstrated that CIS thin films made by conventional techniques contain domains resulting from fluctuations in chemical composition[1-2, 5]. Undesirable recombination of charge carriers takes place at the boundaries between the nanodomains within such a CIS based PV absorber. Therefore, what is also required is a solution to controlling, and ideally optimizing, the boundaries between, these nanodomains with varying chemical compositions.

Heretofore, the requirements of reduced raw materials requirements, reduced thickness and controlled boundaries between nanodomains referred to above have not been fully met. What is, therefore, needed is a solution that simultaneously solves all of these problems.

SUMMARY OF THE INVENTION

There is a need for the following embodiments of the invention. Of course, the invention is not limited to these embodiments.

According to an embodiment of the invention, a process comprises: providing a first precursor on a first substrate; providing a second precursor on a second substrate; contacting the first precursor and the second precursor; reacting the first precursor and the second precursor to form a chemical reaction product; and moving the first substrate and the second substrate relative to one another to separate the chemical reaction product from at least one member selected from the group consisting of the first substrate and the second substrate, characterized in that, to control formation of a segregated phase domain structure within the chemical reaction product, a constituent of at least one member selected from the group consisting of the first precursor and the second precursor is provided in a quantity that substantially regularly periodically varies from a mean quantity with regard to basal spatial location.

According to another embodiment of the invention, a machine comprises: a first substrate; and a second substrate coupled to the first substrate, characterized in that, to control formation of a segregated phase domain structure within a chemical reaction product by controlling an amount of a constituent of a precursor that is present per unit surface area, at least one member selected from the group consisting of the first substrate and the second substrate defines a substantially regularly periodically varying relief with respect to basal spatial location.

According to another embodiment of the invention, a composition of matter comprises: a chemical reaction product defining a first surface and a second surface, characterized in that the chemical reaction product includes a segregated phase domain structure including a plurality of domain structures, wherein at least one of the plurality of domain structures includes at least one domain that extends from a first surface of the chemical reaction product to a second surface of the chemical reaction product.

These, and other, embodiments of the invention will be better appreciated and understood when considered in conjunction with the following description and the accompanying drawings.

It should be understood, however, that the following description, while indicating various embodiments of the invention and numerous specific details thereof, is given by way of illustration and not of limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer conception of embodiments of the invention, and of the components combinable with, and operation of systems provided with, embodiments of the invention, will become more readily apparent by referring to the exemplary, and therefore nonlimiting, embodiments illustrated in the drawings, wherein identical reference numerals (if they occur in more than one view) designate the same elements. Embodiments of the invention may be better understood by reference to one or more of these drawings in combination with the description presented herein. It should be noted that the features illustrated in the drawings are not necessarily drawn to scale.

DESCRIPTION OF PREFERRED EMBODIMENTS

Figure 1A:
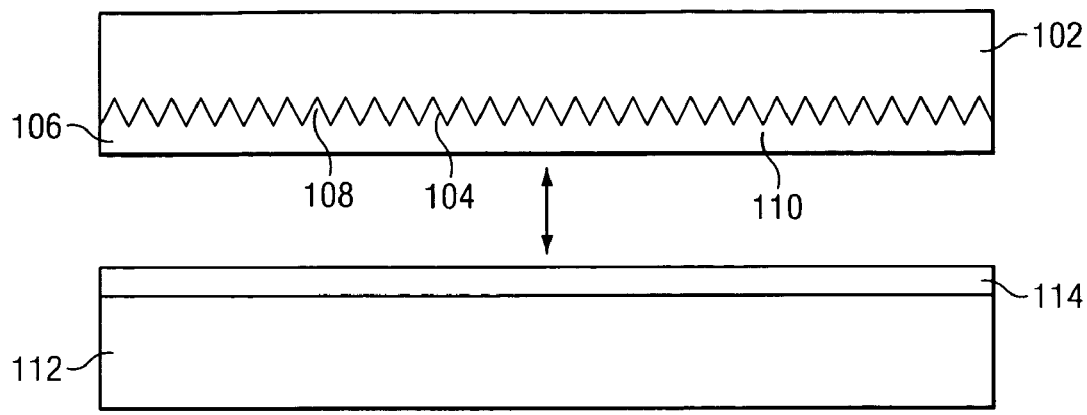
FIGS. 1A-1C are elevational views of pairs of substrates where at least one of each pair defines a substantially regularly periodically varying relief with respect to basal spatial location, representing an embodiment of the invention.

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application several publications are referenced by Arabic numerals, or principal author's name followed by year of publication, within parentheses or brackets. Full citations for these, and other, publications may be found at the end of the specification immediately preceding the claims after the section heading References. The disclosures of all these publications in their entireties are hereby expressly incorporated by reference herein for the purpose of indicating the background of embodiments of the invention and illustrating the state of the art.

The instant application contains disclosure that is also contained in copending U.S. Ser. No. 11/331,442, filed Jan. 12, 2006; and U.S. Ser. No. 11/330,905, filed Jan. 12, 2006, the entire contents of both of which are hereby expressly incorporated by reference for all purposes. The below-referenced U.S. patents disclose embodiments that are useful for the purposes for which they are intended. The entire contents of U.S. Pat. Nos. 6,736,986; 6,881,647; 6,787,012; 6,559,372; 6,500,733; 6,797,874; 6,720,239; 6,593,213; and 6,313,479 are hereby expressly incorporated by reference herein for all purposes.

The context of the invention can include controlling formation of a segregated phase domain structure within a chemical reaction product. The context of the invention can include machinery to control formation of a segregated phase domain structure by controlling an amount of a constituent of a precursor that is present per unit surface area. The context of the invention can include a chemical reaction product that includes a segregated phase domain structure including a plurality of domain structures.

The segregated phase domain structure includes a plurality of domain structures. The invention can include domain structures that define percolation networks. The invention can include domain structures that minimize path length required for charge carrier collection (e.g., columnar domains). At least one of the plurality of domain structures can include at least one domain that extends from a first surface of the chemical reaction product to a second surface of the chemical reaction product. The invention can include domain structures that minimize boundary surface area (e.g., circular columnar domains) and/or minimize boundary surface along preferred path directions (e.g., fluted circular columnar domains). The invention can include the use of sodium to make boundaries between domain structures less fuzzy (i.e., more discrete).

The invention can include a characteristic length scale for the (intradomain) size of the domains (e.g., "r" for internal radius). The invention can include a characteristic length scale for the (interdomain) size of the separation(s) between domains (e.g., "d" for center-to-center distance). By varying the ratio of the characteristic domain size to characteristic domain separation, the invention enables control of a relative volume of two (or more) domains. By varying the absolute characteristic values, the invention enables control of the ratio of junction volume to the bulk field free volume in two (or more) phase domains. The invention can include controlling the spacing of the domains to control a ratio of domains and/or phases with regard to volume or other parameter.

The invention can include a characteristic size distribution of the domains. Embodiments of the invention can be characterized by a narrow size distribution of "r" (i.e., monomodal). For instance, embodiments of the invention can be characterized by a size distribution in which 80% of the instances of a domain are characterized by a size that is within 20% (plus or minus) of a scalar value r. It can be advantageous if 90% of the instances of a domain are characterized by a size that is within 10% (plus or minus) of a scalar value "r." Alternatively, embodiments of the invention can be characterized by a plurality of narrow size distributions of "r" (i.e., multimodal). Preferred embodiments of the invention avoid random size distributions (e.g., of "r").

The invention can include domain structures of a size that are from approximately 1 nm to approximately 1 um, preferably from approximately 5 nm to approximately 100 nm. The invention can include domain structures that repeat on multiples of a crystallographic unit cell lattice parameter of from approximately 1 nm to approximately 200 nm, preferably from approximately 5 nm to approximately 50 nm. Nevertheless, it is important to appreciate that the exact size (magnitude) of the domains is not important.

The invention can include a characteristic size distribution of the domain separations. Embodiments of the invention can be characterized by a narrow size distribution of "d" (i.e., monomodal). For instance, embodiments of the invention can be characterized by a separation distribution in which 80% of the instances of a domain are characterized by a separation that is within 20% (plus or minus) of an integer multiple of a scalar value d. It can be advantageous if 90% of the instances of a domain are characterized by a separation that is within 10% (plus or minus) of an integer multiple of a scalar value "d." Alternatively, embodiments of the invention can be characterized by a plurality of narrow separation distributions of "r" (i.e., multimodal). Preferred embodiments of the invention avoid random separation distributions (e.g., of "d").

The invention can include domain structures that repeat (are spaced) on a period of from approximately 1 nm to approximately 1 um, preferably from approximately 5 nm to approximately 100 nm. The invention can include domain structures that repeat on multiples of a period of from approximately 1 nm to approximately 200 nm, preferably from approximately 5 nm to approximately 50 nm. Nevertheless, it is important to appreciate that the exact size (magnitude) of the domain separation(s) is not important.

The invention can include domain structures that define 6 fold, 4 fold or other symmetry, in two or three dimensions. However, it is important to appreciate that the exact symmetry is not important. The invention can include domain structures that define short range order. The invention can include domain structures that define long range order.

Figure 7A:
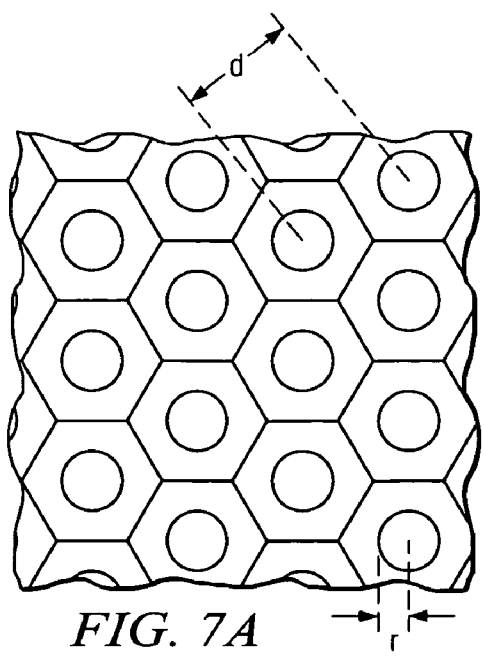
FIGS. 7A-7C are schematic views of a hexagonal domain structure, representing an embodiment of the invention.
Figure 7B:
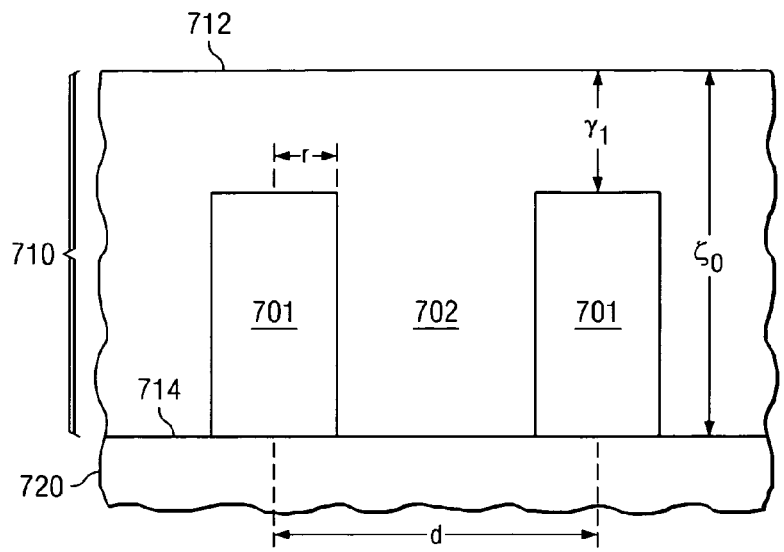
Figure 7C:
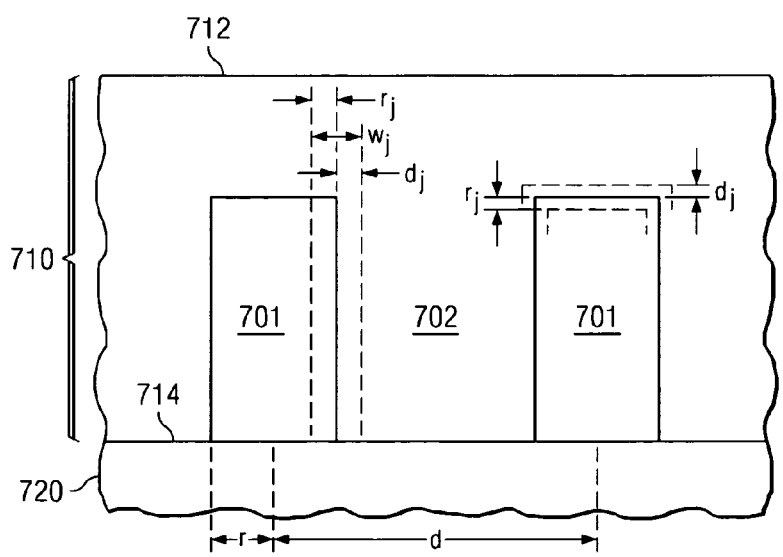

Referring to FIGS. 7A-7C, optimization of a hexagonal domain structure with regard to minimizing total recombination R will now be described. FIGS. 7A-7B relate to a first order approximation for minimizing total recombination R for a hexagonal domain structure array having circular columns, assuming the interabsorber junction region is narrow compared to the scalar dimensions r and d. Referring to FIGS. 7A-7B, a chemical reaction product 710 defining a first surface 712 and a second surface 714 is coupled to a back contact 720. The chemical reaction product 710 includes a segregated phase domain structure including a cylindrical domain structure 701 and a matrix domain structure 702. In this case, the matrix domain structure extends from the first surface 712 of the chemical reaction product 710 to the second surface 714 of the chemical reaction product 710.

The total volume of each hexagonal cell of height $\tau_0$ is given by $$((3)^{1/2}d^2\tau_0)/2$$

where d is the hexagonal cell-to-cell spacing. The total recombination R (per cell) equals the recombination in cylindrical domain region one $R_1$ plus the recombination in hexagonal matrix domain region two $R_2$ plus the recombination at the interface of regions one and region two $R_i$.

$$R=R_1+R_2+R_i$$

The recombination in cylindrical domain region one is given by $$R_1=\rho_1(\text{volume1})=\rho_1((\tau_0-\tau_1)\pi r^2)$$

where $\rho_1$ is the bulk recombination rate in cylindrical domain region one.

The recombination in hexagonal matrix domain region two is given by $$R_2=\rho_2(((3)^{1/2}d^2\tau_0)/2-(\tau_0-\tau_1)\pi r^2)$$

where $\rho_2$ is the bulk recombination rate in hexagonal matrix domain region two.

The recombination at the interface between the cylindrical region one and the matrix domain region two is given by $$R_i=\sigma_i(2\pi r(\tau_0-\tau_1)+\pi r^2)$$

where $\sigma_i$ is the interface (junction) surface recombination velocity. The recombination rates $\rho_1$ and $\rho_2$, and the recombination velocity $\sigma_i$ are materials properties that depend on compositions and processing histories.

FIG. 7C relates to a second order approximation for minimizing total recombination R for a hexagonal domain structure array having circular columns, where the junction width is not small compared to r and/or d. Referring to FIG. 7C, the total junction width is equal to the cylindrical domain junction width plus the matrix domain junction width $$w_j = r_j + d_j$$

The total recombination R (per cell) equals the recombination in the cylindrical field-free domain region one $R_1$ plus the recombination in the hexagonal matrix field-free domain region two $R_2$ plus the recombination in the annular space charge recombination region one $R_{1j}$ plus the recombination in the annular space charge recombination region two $R_{2j}$.

$$R = R_1 + R_2 + R_{1j} + R_{2j}$$

The following four equations for the terms $R_1$, $R_2$, $R_{1j}$ and $R_{2j}$ are valid when $\tau_1 \geq d_j$. If $\tau_1 < d_j$, then set $\tau_1 = 0$. The recombination in cylindrical field-free domain region one is given by $$R_1 = \rho_1((\tau_0 - \tau_1 - r_j)\pi(r - r_j)^2)$$

where $\rho_1$ is the bulk recombination rate in cylindrical field-free domain region one. The recombination in hexagonal matrix field-free domain region two is given by $$R_2 = \rho_2(((3)^{1/2}d^2\tau_0)/2 - (\tau_0 - \tau_1 + d_j)\pi(r + d_j)^2)$$

where $\rho_2$ is the bulk recombination rate in hexagonal matrix field-free domain region two. The recombination in the annular space charge recombination region one is given by $$R_{1j} = \rho_{1j}((\tau_0 - \tau_1)\pi r^2 - (\tau_0 - \tau_1 - r_j)\pi(r - r_j)^2)$$

where $\rho_{1j}$ is the bulk recombination rate in the annular space charge recombination region one. The recombination in the annular space charge recombination region one is given by $$R_{2j} = \rho_{2j}((\tau_0 - \tau_1 + d_j)\pi(r + d_j)^2 - (\tau_0 - \tau_1)\pi r^2)$$

where $\rho_{2j}$ is the bulk recombination rate in the annular space charge recombination region two. The recombination rates $\rho_1$, $\rho_2$, $\rho_{1j}$ and $\rho_{2j}$ are materials properties that depend on compositions and processing histories.

Figure 1B:
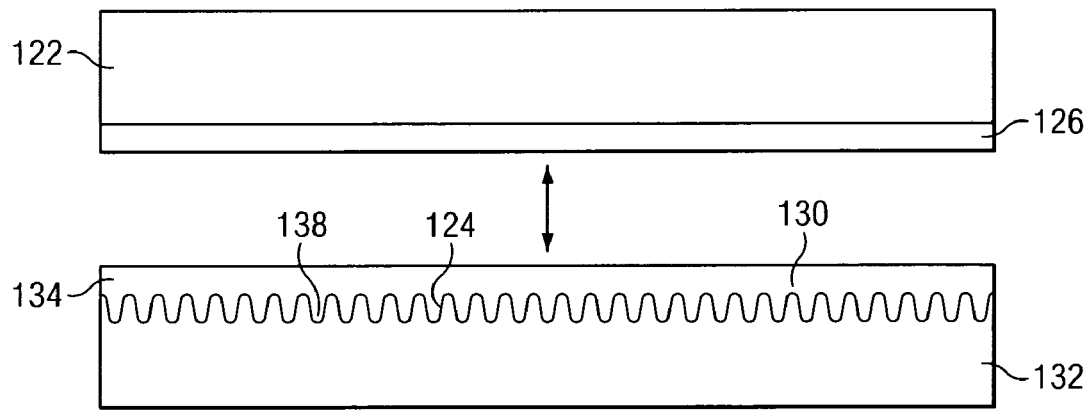
Figure 1C:
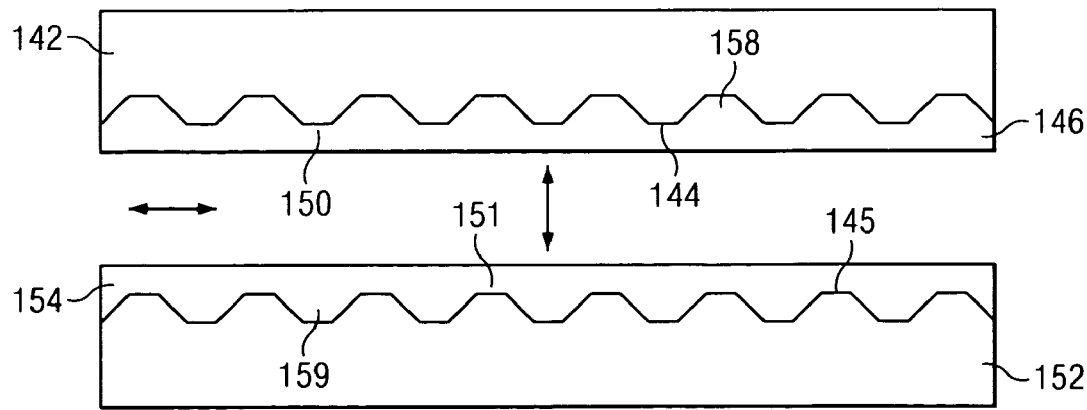

Referring to FIGS. 1A-1C, the invention can include substantially regularly periodically increasing an amount of a precursor by planar coating a substantially regularly periodically relieved surface. Referring to FIG. 1A, a first substrate 102 includes a substantially regularly periodically relieved surface 104. A first precursor 106 is coupled to the substantially regularly periodically relieved surface 104. It can be appreciated that there is relatively more of the first precursor 106 corresponding to a basal spatial location centered at a relief cell center position 108 compared to a relief cell edge position 110. A second precursor 114 is coupled to a second substrate 112. The first substrate 102 and the second substrate 112 are movable relative to one another. When the first precursor 106 and the second precursor 114 are contacted and heated (optionally under the influence of an electric field) the resulting reaction product can be compositionally rich in the constituents of the first precursor at a location corresponding to the relief cell center position 108, especially if the basal diffusion rate is much lower than the perpendicular diffusion rate.

Referring to FIG. 1B, a first precursor 126 is coupled to a first substrate 122. A second substrate 132 includes a substantially regularly periodically relieved surface 124. A second precursor 134 is coupled to the substantially regularly periodically relieved surface 124. It can be appreciated that there is relatively more of the second precursor 134 at a relief cell center position 138 compared to a relief cell edge position 130. The first substrate 122 and the second substrate 132 are movable relative to one another. When the first precursor 126 and the second precursor 134 are contacted and heated (optionally under the influence of an electric field) the resulting reaction product will be compositionally rich in the constituents of the second precursor at a location corresponding to the relief cell center position 138.

Referring to FIG. 1C, a first substrate 142 includes a substantially regularly periodically relieved surface 144. A first precursor 146 is coupled to the substantially regularly periodically relieved surface 144. It can be appreciated that there is relatively more of the first precursor 146 at a relief cell center position 158 compared to a relief cell edge position 150. A second substrate 152 includes a substantially regularly periodically relieved surface 145. A second precursor 154 is coupled to the substantially regularly periodically relieved surface 145. It can be appreciated that there is relatively more of the second precursor 154 at a relief cell center position 159 compared to a relief cell edge position 151. The first substrate 142 and the second substrate 152 are movable relative to one another. When the first precursor 146 and the second precursor 154 are contacted and heated (optionally under the influence of an electric field) the resulting reaction product will be compositionally rich in the constituents of the first precursor at a location corresponding to the relief cell center position 158 and will be compositionally rich in the constituents of the second precursor at a location corresponding to the relief cell center position 159.

Figure 2A:
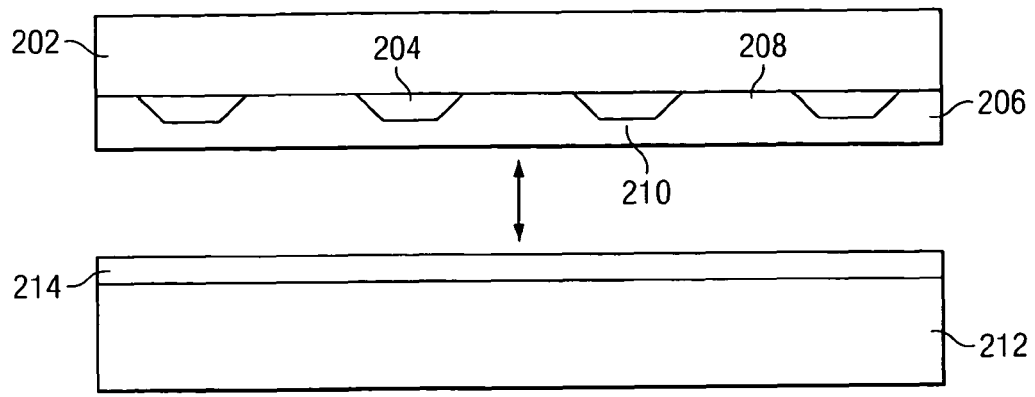
FIGS. 2A-2C are elevational views of pairs of substrates where at least one of each pair carriers a constituent of a precursor in a quantity that substantially regularly periodically varies from a mean quantity with regard to basal spatial location.
Figure 2B:
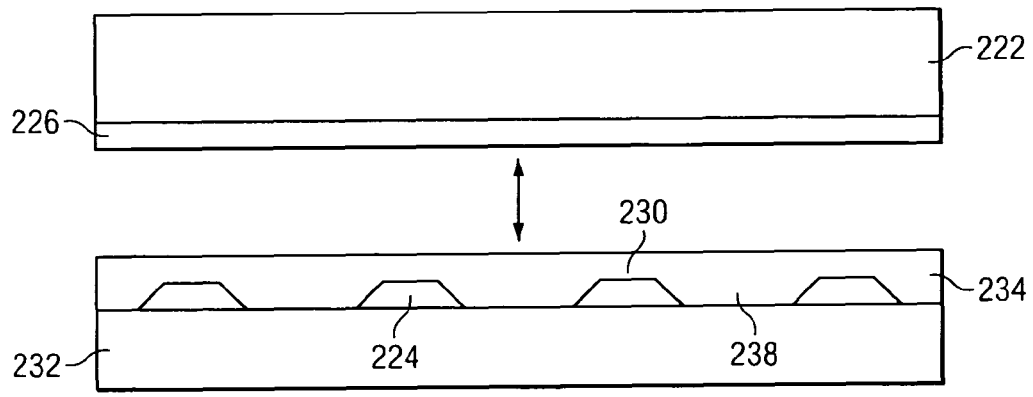
Figure 2C:
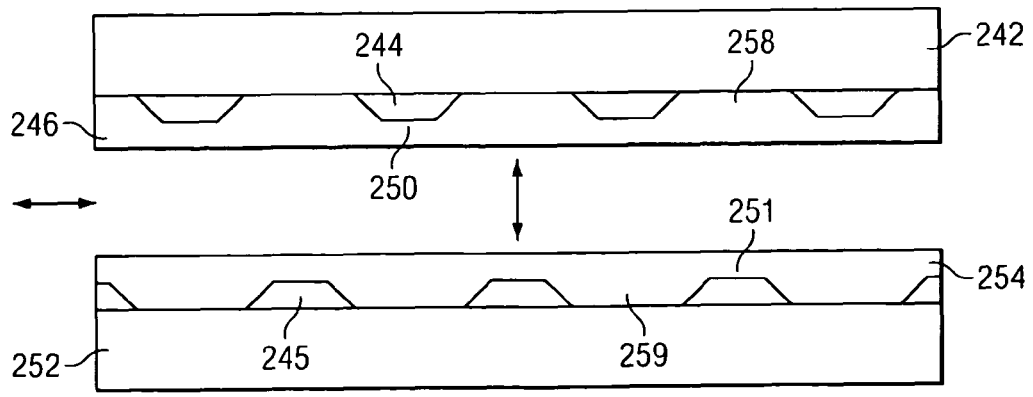

Referring to FIGS. 2A-2C, the invention can include substantially regularly periodically increasing an amount of a precursor by previously depositing a plurality of constituent sources that include an excess of the constituent relative to a mean quantity. Referring to FIG. 2A, a first substrate 202 includes a plurality of substantially regularly periodically located constituent sources 204. A first precursor 206 is coupled to the sources 204. It can be appreciated that there is relatively more of the first precursor 206 in positions 208 without the sources 204 compared to positions 210 with the sources 204. A second precursor 214 is coupled to a second substrate 212. The first substrate 202 and the second substrate 212 are movable relative to one another. When the first precursor 206 and the second precursor 214 are contacted and heated (optionally under the influence of an electric field) the resulting reaction product will be compositionally rich in the constituents of the first precursor at locations corresponding to the relief cell center position 208.

Referring to FIG. 2B, a first precursor 226 is coupled to a first substrate 222. A second substrate 232 includes a plurality of substantially regularly periodically located constituent sources 224. A second precursor 234 is coupled to the sources 224. It can be appreciated that there is relatively more of the second precursor 234 at a center position 238 compared to edge positions 230. The first substrate 222 and the second substrate 232 are movable relative to one another. When the first precursor 226 and the second precursor 234 are contacted and heated (optionally under the influence of an electric field) the resulting reaction product will be compositionally rich in the constituents of the second precursor at a location corresponding to the relief cell center position 238.

Referring to FIG. 2C, a first substrate 242 includes a plurality of substantially regularly periodically located constituent sources 244. A first precursor 246 is coupled to the plurality of substantially regularly periodically located sources 244. It can be appreciated that there is relatively more of the first precursor 246 at a center position 258 compared to an edge position 250. A second substrate 252 includes a plurality of substantially regularly periodically located sources 245. A second precursor 254 is coupled to the plurality of substantially regularly periodically located sources 245. It can be appreciated that there is relatively more of the second precursor 254 at center position 259 compared to an edge position 251. The first substrate 242 and the second substrate 252 are movable relative to one another. When the first precursor 246 and the second precursor 254 are contacted and heated (optionally under the influence of an electric field) the resulting reaction product will be compositionally rich in the constituents of the first precursor at a location corresponding to the center position 258 and will be compositionally rich in the constituents of the second precursor at a location corresponding to the center position 259.

Figure 3A:
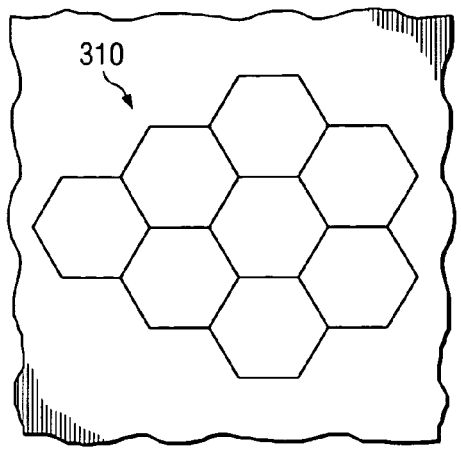
FIGS. 3A-3D are plan views of segregated phase domain structures including a segregated phase domain hexagonal array, representing an embodiment of the invention.
Figure 3B:
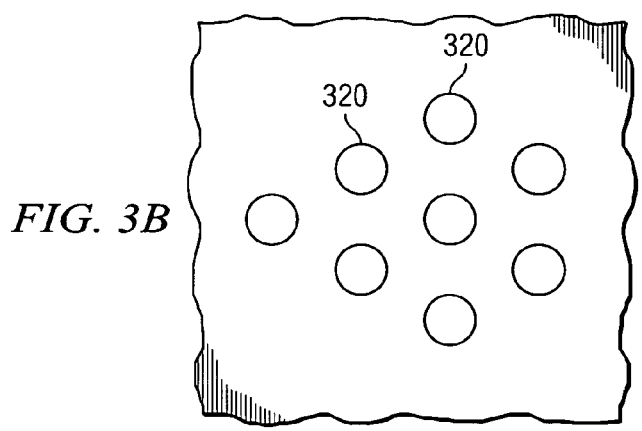
Figure 3C:
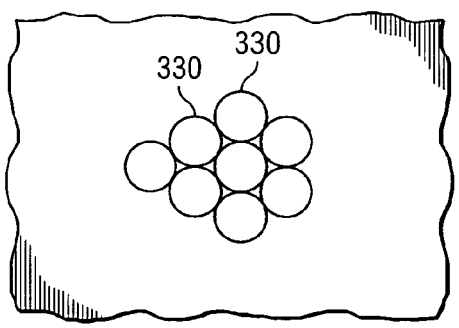
Figure 3D:
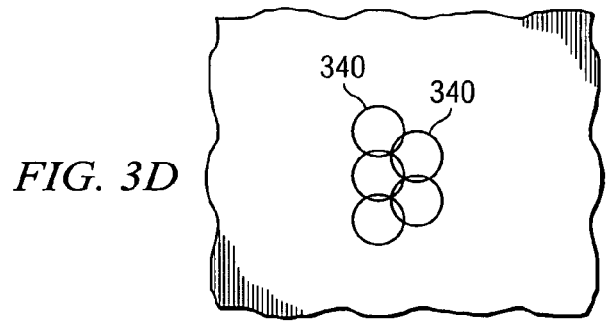
Figure 3E:
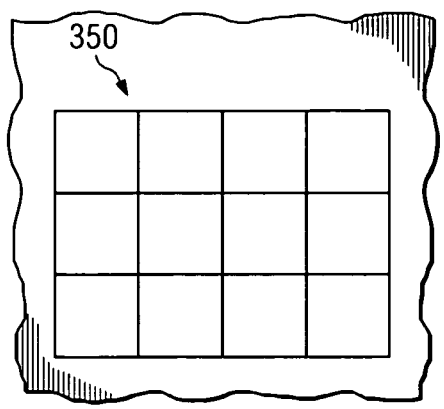
FIGS. 3E-3H are plan views of segregated phase domain structures including a segregated phase domain orthogonal array, representing an embodiment of the invention.
Figure 3F:
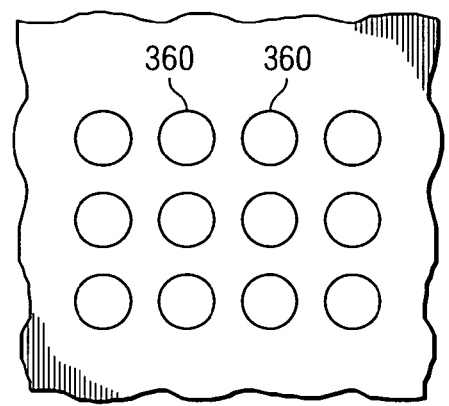
Figure 3G:
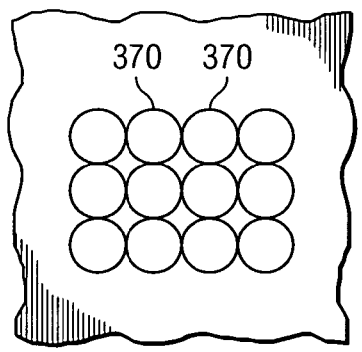
Figure 3H:
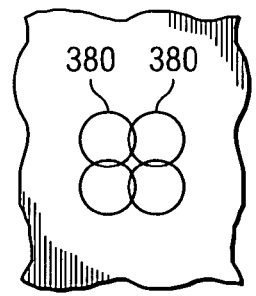

Referring to FIGS. 3A-3H, the relieved surface and/or the constituent sources can be located across a surface to define a hexagonal symmetry, an orthogonal symmetry, or other symmetry and/or space group. Referring to FIG. 3A, the surface relief or sources can define a hexagonal grid 310. Referring to FIG. 3B, reaction products 320 whose location correspond to the grid 310 can be columnar (to facilitate charge carrier transport) with a circular circumference. Referring to FIG. 3C, the ratio of matrix domain area to columnar domain area can be controlled by locating the reaction product columns 330 closer to one another (e.g., so that the columns are just touching). Referring to FIG. 3D, the ratio of matrix domain to columnar domain can be lowered still further by locating the reaction product columns 340 so that they overlap. Referring to FIG. 3E, the surface relief or sources can define an orthogonal grid 350. Referring to FIG. 3F, reaction products 360 whose location correspond to the grid 350 can be columnar (to facilitate charge carrier transport) with a circular circumference. Referring to FIG. 3G, the ratio of matrix domain to columnar domain can be controlled by locating the reaction product columns 370 closer to one another (e.g., so that the columns are just touching). Referring to FIG. 3H, the ratio of matrix domain to columnar domain can lowered still further by locating the reaction product columns 380 so that they overlap.

EXAMPLES

Specific embodiments of the invention will now be further described by the following, nonlimiting examples which will serve to illustrate in some detail various features. The following examples are included to facilitate an understanding of ways in which an embodiment of the invention may be practiced. It should be appreciated that the examples which follow represent embodiments discovered to function well in the practice of the invention, and thus can be considered to constitute preferred mode(s) for the practice of the embodiments of the invention. However, it should be appreciated that many changes can be made in the exemplary embodiments which are disclosed while still obtaining like or similar result without departing from the spirit and scope of an embodiment of the invention. Accordingly, the examples should not be construed as limiting the scope of the invention.

Example 1

Figure 4A:
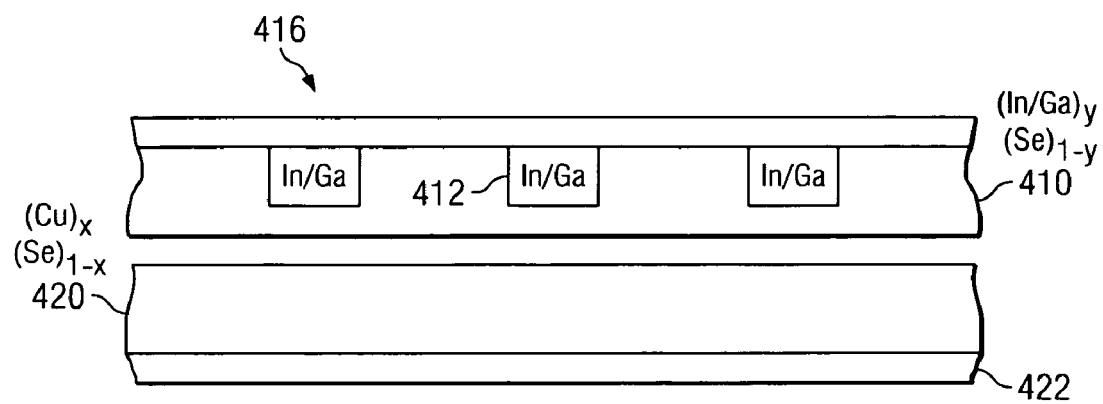
FIGS. 4A-4C are schematic elevational views of a process of controlling formation of a segregated phase domain structure using a back surface contact that defines a substantially regularly periodically varying relief (and electric field strength) with respect to basal spatial location, representing an embodiment of the invention.
Figure 4B:
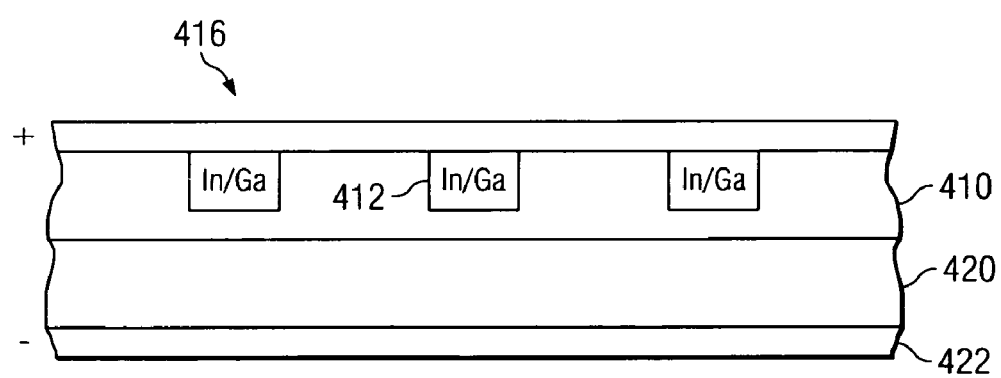
Figure 4C:
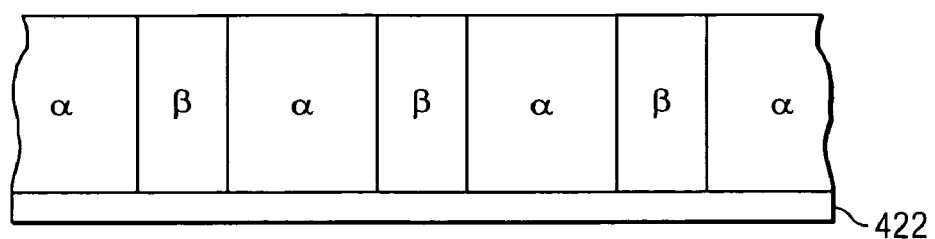

Referring to FIGS. 4A-4C, this example relates to an embodiment of the invention including planar coating of a first precursor 410 on a surface of a tool 416 where a first precursor constituent is substantially regularly periodically increased by previously depositing a plurality of constituent sources 412 that include an excess of the constituent relative to a mean quantity. This embodiment also includes the use of a switchable (e.g., on-off), modulatable (e.g., field strength), reversible (e.g., polarity), electric field.

Referring to FIG. 4A, a first precursor 410 includes sources 412. A second precursor 420 is provided on a back contact 422. Referring to FIG. 4B, the first precursor 410 and the second precursor 420 are contacted and heated, and an electric field is applied. With the bias of the field applied as depicted in FIG. 4B, the electric field tends to drive at least some of the copper ions away from the tool. The field as depicted exerts a force on the copper that is opposite the direction of chemical drive on the copper, and can be termed reverse bias (inapposite to forward bias). Of course, the direction of the field can selected, the magnitude of the field can be controlled and the field can be switched on and/or off. Meanwhile, the sources 412 form indium-gallium rich beta domains. Referring to FIG. 4C, after the electric field is removed, the tool is separated and the domains remain intact.

Example 2

Figure 5A:
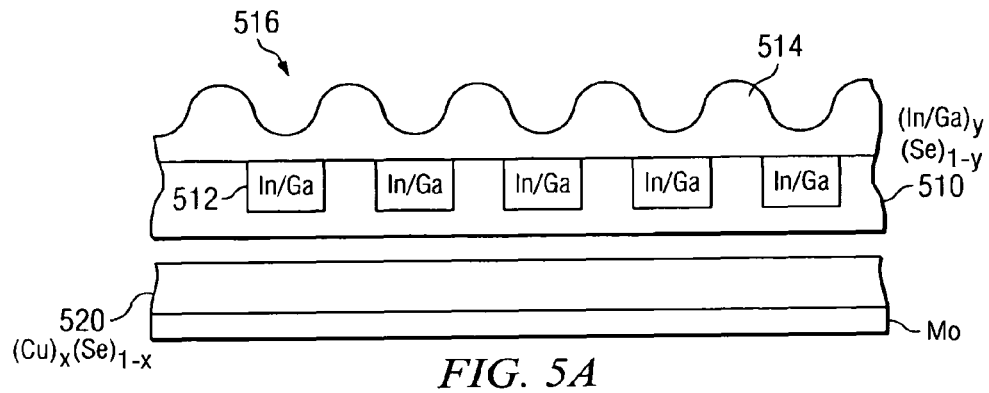
FIGS. 5A-5C are schematic elevational views of a process of controlling formation of a segregated phase domain structure using a tool that defines a substantially regularly periodically varying electric field strength with respect to basal spatial location, representing an embodiment of the invention.
Figure 5B:
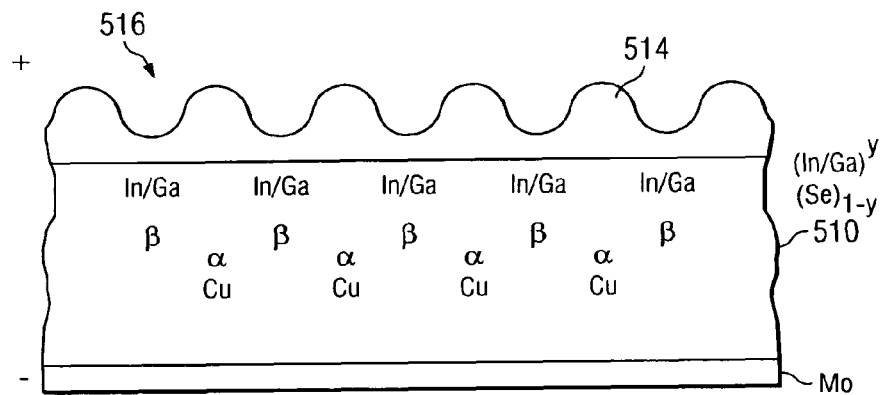
Figure 5C:
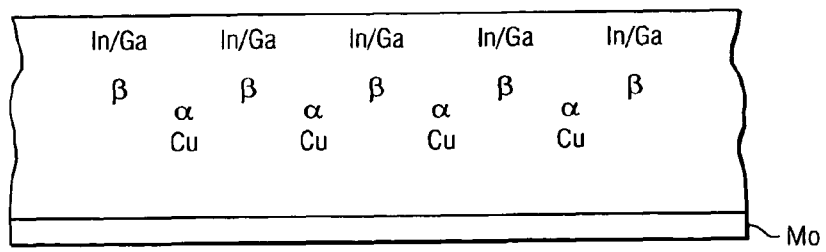

Referring to FIGS. 5A-5C, this example relates to an embodiment of the invention including planar coating of a first precursor on a surface of a tool where a first precursor constituent is substantially regularly periodically increased by previously depositing a plurality of constituent sources that include an excess of the constituent relative to a mean quantity. This embodiment of the invention also includes a back surface contact that is planar coated with a second precursor. This embodiment includes the use of a switchable (e.g., on-off), modulatable (e.g., field strength), reversible (e.g., polarity), substantially regularly periodically varying electric field strength with respect to basal spatial location.

Referring to FIG. 5A, a first precursor 510 includes (In/Ga)$_y$(Se)$_{1-y}$ and In/Ga sources 512. The first precursor 510 is coupled to a planarized release layer 514 that is coupled to a substantially regularly periodically relieved surface of a tool 516. The sources 512 can be self assembled at locations corresponding to the relieved surface by photo-ionizing In/Ga particles and applying a negative bias to the tool, or flood gun ionizing the In/Ga particles and applying a positive bias to the tool. The use of photoionization and/or floodgun ionization to enable positioning of quantum dots is described by U.S. Pat. No. 6,313,476. Of course, other methods of self-assembly and/or deposition can be used to locate the sources 512, such as self organized epitaxy (e.g., on GaAs) and/or molecular pick-and-place techniques. A second precursor 520 includes Cu$_x$Se$_{1-x}$. Referring to FIG. 5B, the first precursor 510 and the second precursor 520 are contacted and heated, and an electric field is applied. The depicted electric field tends to drive some of the copper ions away from the projections of the relieved tool, thereby forming copper rich alpha domains. Driving the copper away from the tool helps avoid welding the reaction product to the tool. Meanwhile, the sources 512 form indium-gallium rich beta domains. Referring to FIG. 5C, after the electric field is removed, the tool is separated and the domains remain intact.

Example 3

Figure 6A:
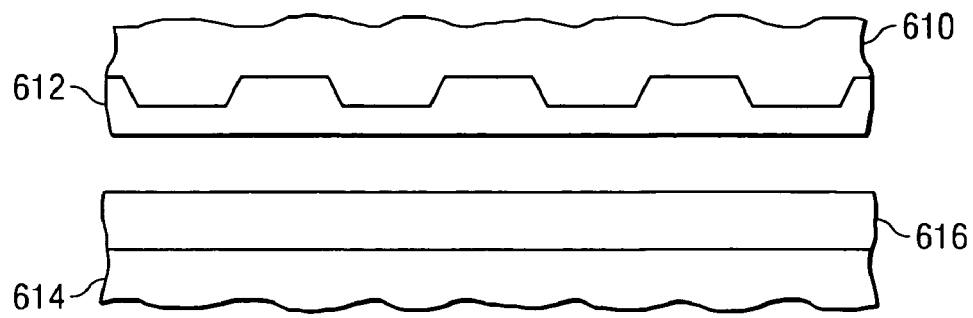
FIGS. 6A-6C are schematic elevational views of a process of controlling formation of a segregated phase domain structure using a tool and a back surface contact both of which define a substantially regularly periodically varying relief with respect to basal spatial location, representing an embodiment of the invention.
Figure 6B:
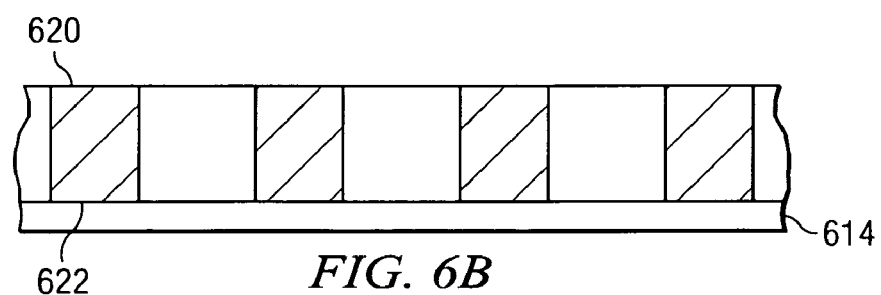
Figure 6C:
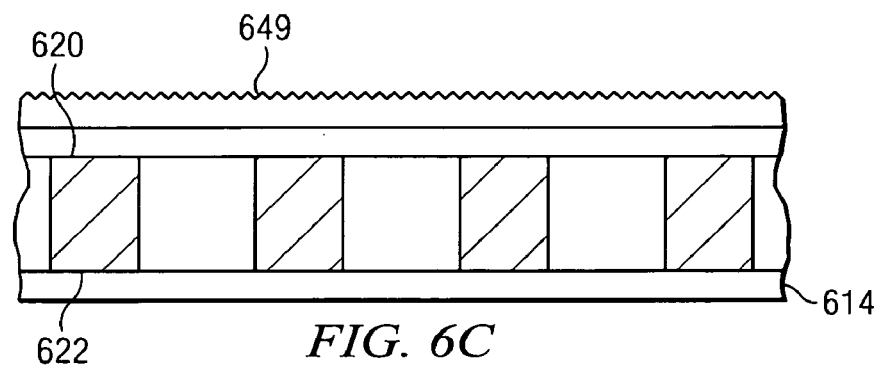

Referring to FIGS. 6A-6C, this example relates to an embodiment of the invention that includes a tool 610 where the quantity of a first precursor 612 is substantially regularly periodically increased by planar coating a substantially regularly periodically relieved surface. This embodiment of the invention also includes a back surface contact 614 where a second precursor 616 is substantially planarized.

Referring to FIG. 6A, locations of additional first precursor can be seen. Referring to FIG. 6B, the resulting domains are columnar and extend from a first surface 620 of the reaction product to a second surface 622. Referring to FIG. 6C, an emitter 649 is coupled to the reaction product.

Example 4

Figure 6D:
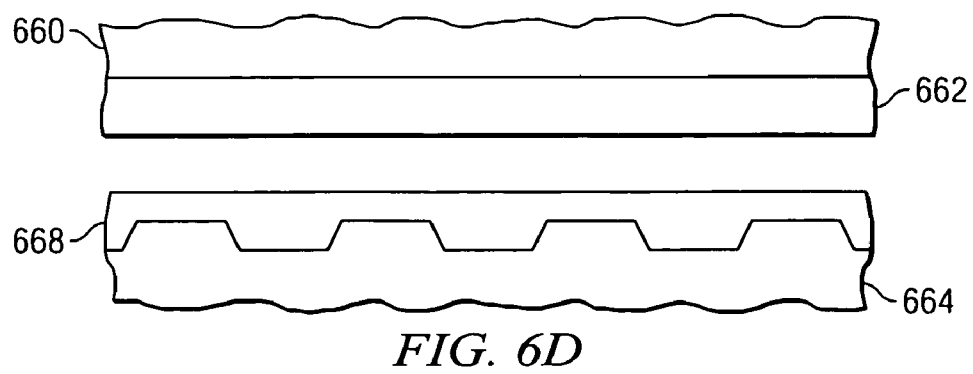
FIGS. 6D-6F are schematic elevational views of a process of controlling formation of a segregated phase domain structure using a back surface contact which defines a substantially regularly periodically varying relief with respect to basal spatial location, representing an embodiment of the invention.
Figure 6E:
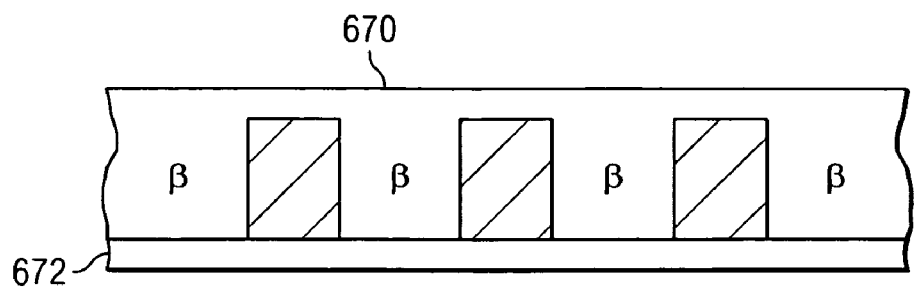
Figure 6F:
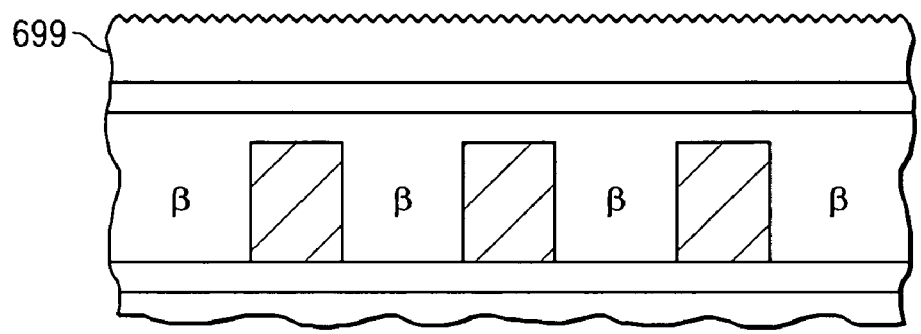

Referring to FIGS. 6D-6F, this example relates to an embodiment of the invention that includes a tool 660 that is planar coated with a first precursor 662. This embodiment of the invention also includes a back surface contact 664 where the quantity of a second precursor 668 is substantially regularly periodically increased by planar coating a substantially regularly periodically relieved surface.

Referring to FIG. 6D, locations of additional second precursor correspond to locations where second precursor rich domains will be located adjacent the second substrate. Referring to FIG. 6E, only one of the resulting domains extends from a first surface 670 of the reaction product to a second surface 672. Referring to FIG. 6F, an emitter 699 is coupled to the reaction product.

Example 5

Figure 8A:
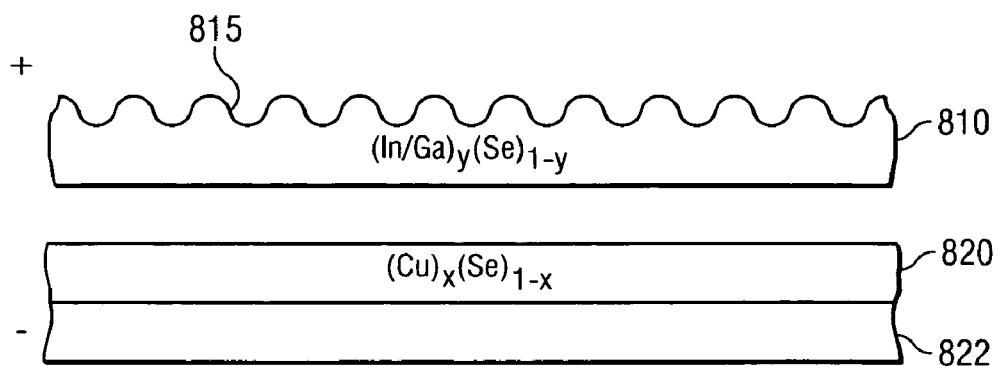
FIGS. 8A-8C are schematic views of a process, representing an embodiment of the invention.
Figure 8B:
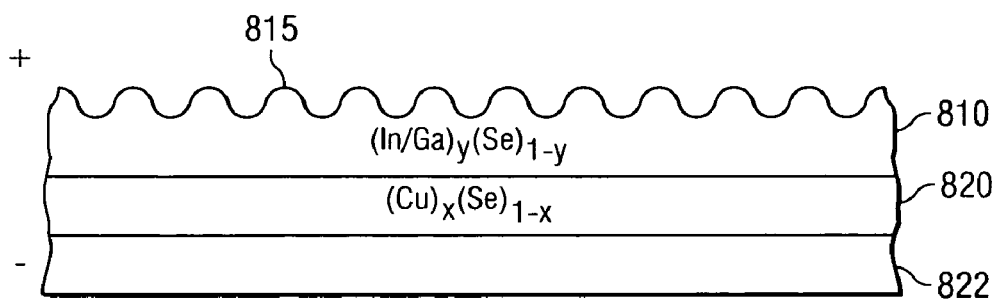
Figure 8C:
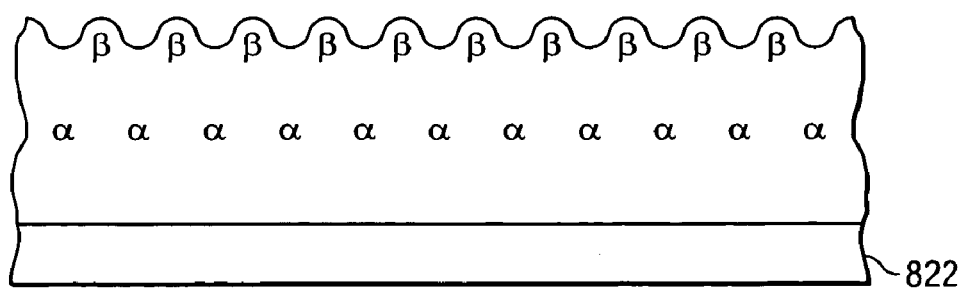

Referring to FIGS. 8A-8C, this example relates to an embodiment of the invention including planar coating of a first precursor on a surface of a tool where a first precursor constituent is substantially regularly periodically increased with regard to a basal plane by utilizing a relieved substrate. The result is an excess of the constituent relative to a mean quantity at locations that correspond to the individual recesses of the relieved surface of the tool. This embodiment also includes the use of a switchable (e.g., on-off), modulatable (e.g., field strength), reversible (e.g., polarity), substantially regularly spatially periodically varying electric field strength with respect to basal spatial location.

Referring to FIG. 8A, a first precursor 810 is provided on a tool surface 815. A second precursor 820 is provided on a back contact 822. Referring to FIG. 5B, the first precursor 810 and the second precursor 820 are contacted and heated, and an electric field is applied. With the bias of the field applied as depicted in FIG. 8B, the electric field tends to drive at least some of the copper ions away from the tool. It is important to appreciate that the strength of the field is higher at those locations of the tool surface that are not relieved. Thus, the electrostatic driving force is also substantially regularly periodically increased with regard to a basal plane. The field as depicted exerts a force on the copper that is opposite the direction of chemical drive on the copper, and can be termed reverse bias (inapposite to forward bias). Of course, the direction of the field can selected, the magnitude of the field can be controlled and the field can be switched on and/or off. Meanwhile, indium-gallium rich beta domains tend to form at locations that correspond to the individual recesses of the relieved surface of the tool. Referring to FIG. 8C, after the electric field is removed, the tool is separated and the domains remain intact.

Example 6

Figure 9A:
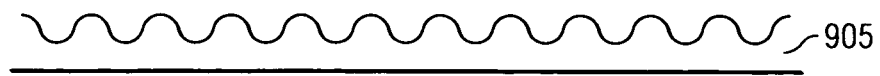
FIGS. 9A-9E are schematic views of a process, representing an embodiment of the invention.
Figure 9B:
Figure 9C:
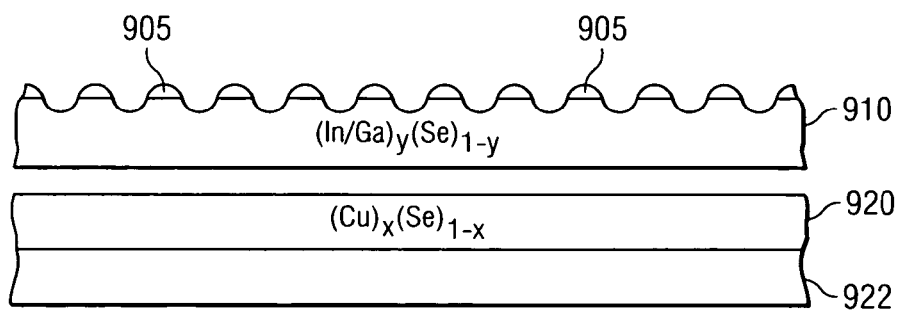

Referring to FIGS. 9A-9C, this example relates to an embodiment of the invention including a first precursor on a surface of a tool where a first precursor constituent is substantially regularly periodically increased with regard to a basal plane by utilizing a relieved substrate in combination with a liquid coating containing the first precursor constituent. The liquid coating is dried and then a remainder of the first precursor is deposited. The result is an excess of the constituent relative to a mean quantity at locations that correspond to the individual recesses of the relieved surface of the tool. This embodiment again includes the use of a switchable (e.g., on-off), modulatable (e.g., field strength), reversible (e.g., polarity), substantially regularly spatially periodically varying electric field strength with respect to basal spatial location.

Figure 9D:
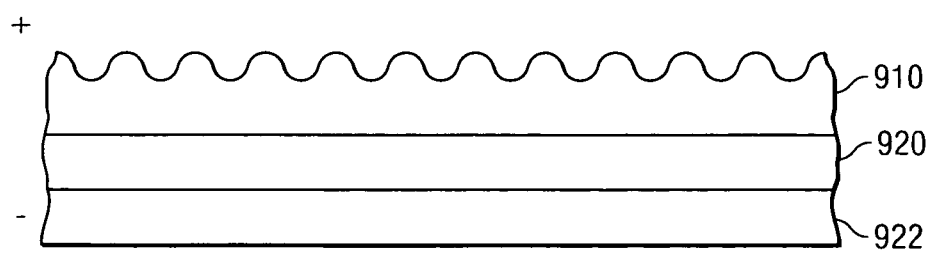
Figure 9E:
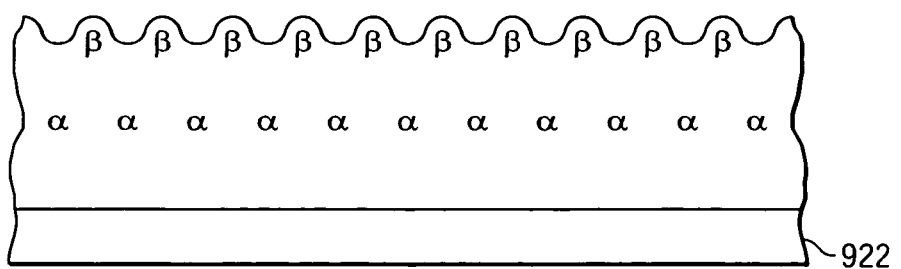

Referring to FIG. 9A, the liquid coating 905 containing the first precursor constituent is applied to a tool surface 515. Referring to FIG. 9B, the liquid coating 905 is dried and capillary forces cause the first precursor constituent to collect at the deepest portions of the individual recesses. Referring to FIG. 9C, the remainder 910 of the first precursor is planar deposited. A second precursor 920 is provided on a back contact 522. Referring to FIG. 9D, the first precursor 910 and the second precursor 920 are contacted and heated, and an electric field is applied. With the bias of the field applied as depicted in FIG. 9D, the electric field tends to drive at least some of the copper ions away from the relieved substrate. It is important to appreciate that the strength of the field is higher at those locations of the tool surface that are not recessed. In this way, the electrostatic driving force is also substantially regularly periodically increased with regard to a basal plane. Again, the direction of the field can selected, the magnitude of the field can be controlled and the field can be switched on and/or off. Referring to FIG. 9E, indium-gallium rich beta domains tend to form at locations that correspond to the individual recesses of the relieved surface of the tool. After the electric field is removed, the tool is separated and the domains remain intact.

Example 7

Referring to FIGS. 10A-10D, this example relates to an embodiment of the invention including a second precursor 1000 on a surface of a back contact 1020 where a second precursor constituent is substantially regularly periodically increased by previously depositing a plurality of constituent sources 1010 that include an excess of the constituent relative to a mean quantity. Again, this embodiment includes the use of a switchable (e.g., on-off), modulatable (e.g., field strength), reversible (e.g., polarity), electric field.

Figure 10A:
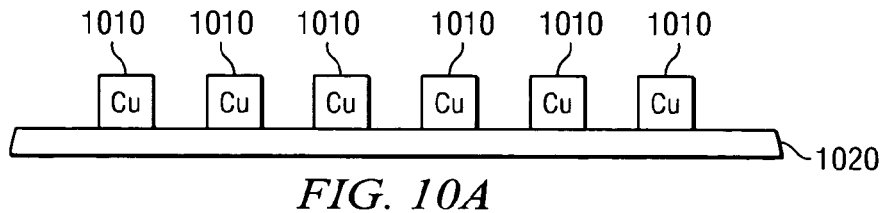
FIGS. 10A-10D are schematic views of a process, representing an embodiment of the invention.
Figure 10B:
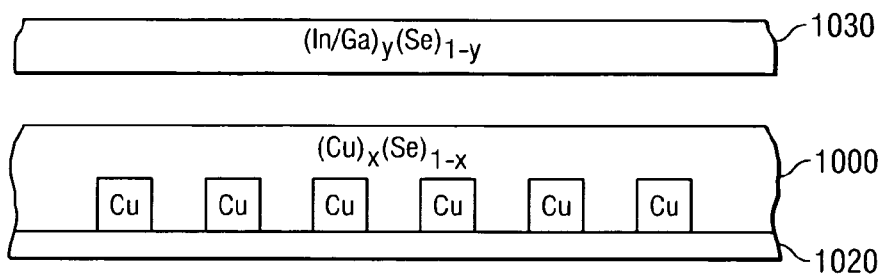
Figure 10C:
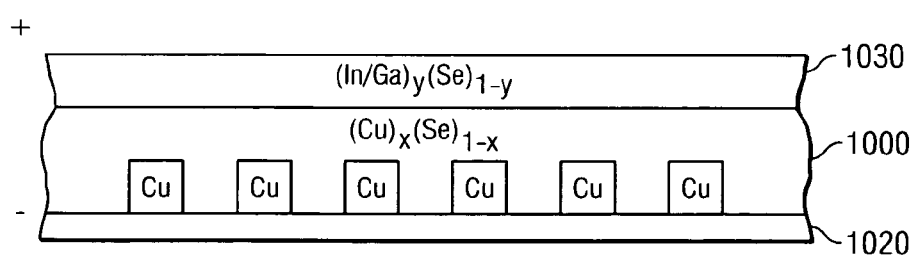
Figure 10D:
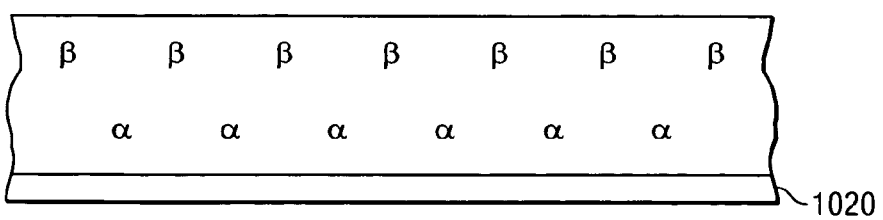
Figure 11A:
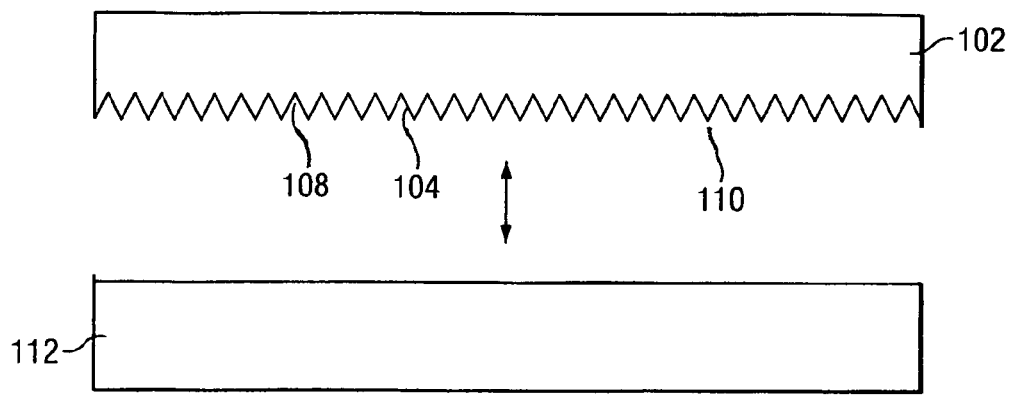
FIGS. 11A-11C are simplified views of the apparatus shown in FIGS. 1A-1C.
Figure 11B:
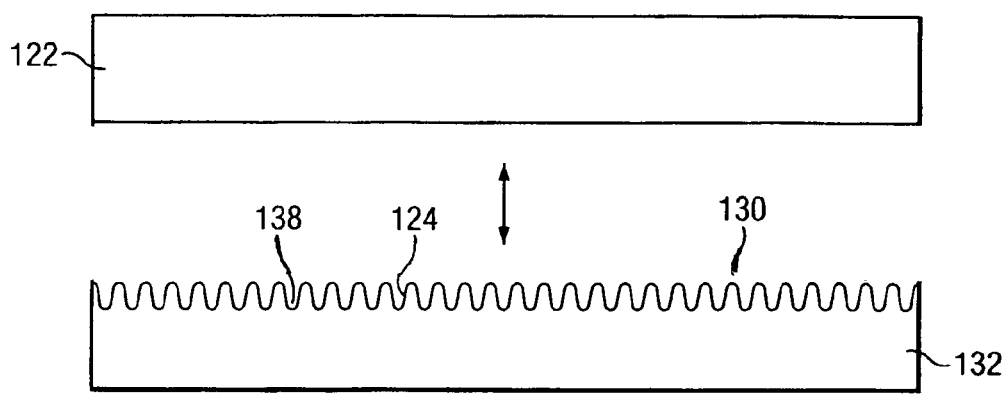
Figure 11C:
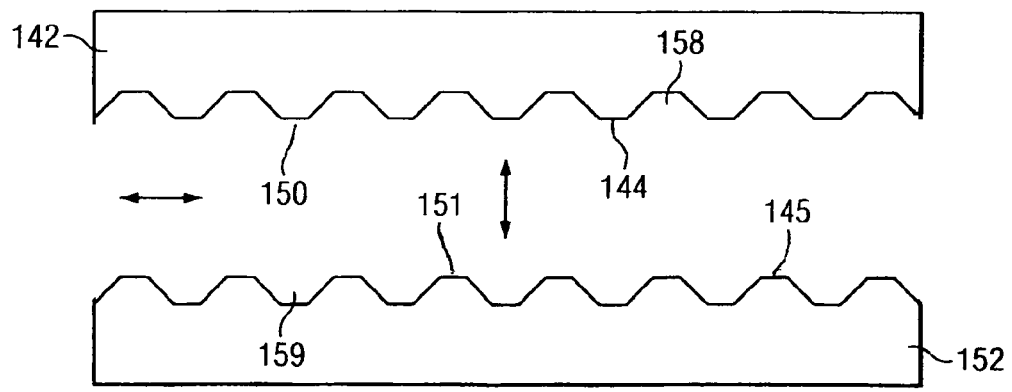
Figure 12A:
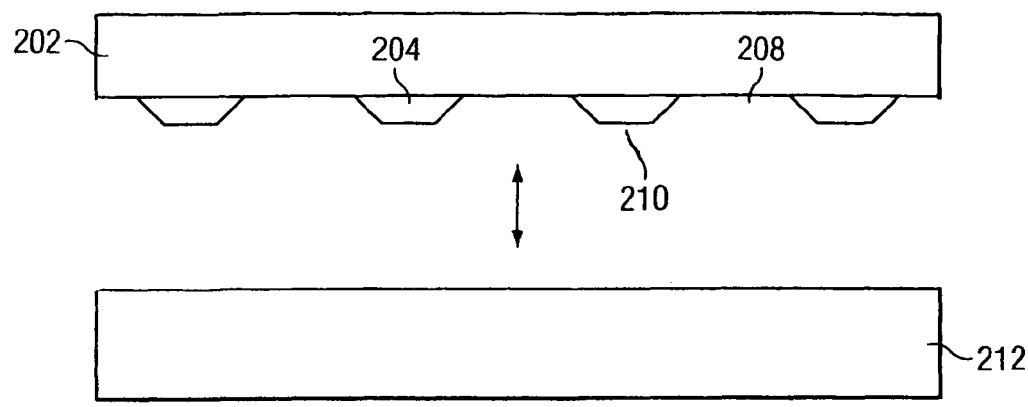
FIGS. 12A-12C are simplified views of the apparatus shown in FIGS. 2A-2C.
Figure 12B:
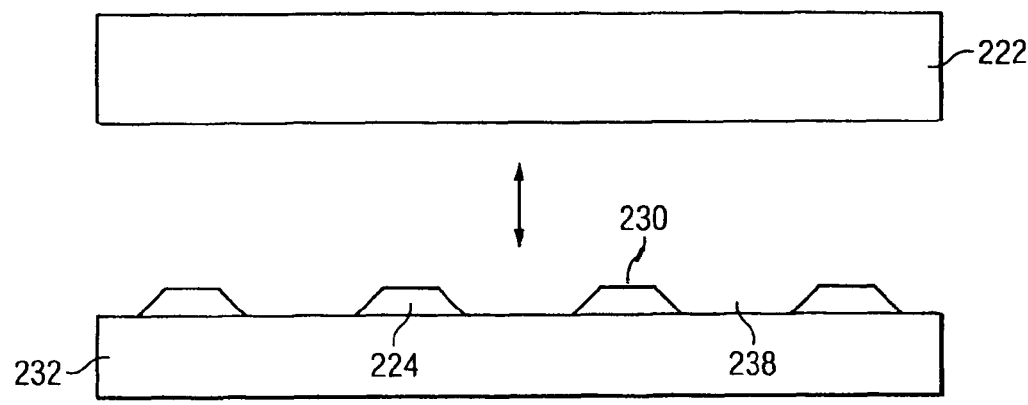
Figure 12C:
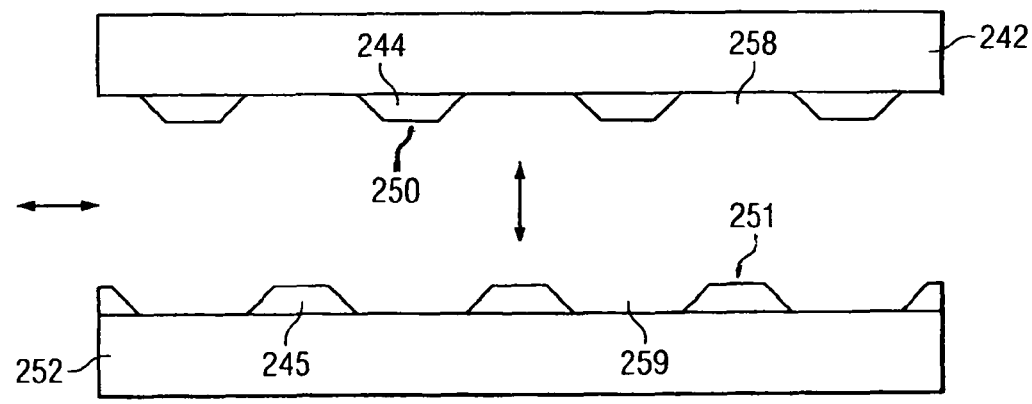

Referring to FIG. 10A, sources 1010 are formed on the back contact 1020 by epitaxy. Referring to FIG. 10B, a first precursor 1030 is provided on the surface of a tool. The first precursor 1030 and the second precursor 1000 are contacted and heated, and the electric field is applied. With the bias of the field applied as depicted in FIG. 10C, the electric field tends to drive at least some of the copper ions away from the surface of the tool. The field as depicted exerts a force on the copper that is opposite the direction of chemical drive on the copper, and can be termed reverse bias. As in the previous examples, the direction of the field can selected, the magnitude of the field can be controlled and the field can be switched on and/or off. Meanwhile, the sources 1010 form copper rich alpha domains. Referring to FIG. 10D, after the electric field is removed, the tool is separated and the domains remain intact.

Practical Applications

A practical application of the invention that has value within the technological arts is the manufacture of photovoltaic devices such as absorber films or electroluminescent phosphors. Further, the invention is useful in conjunction with the fabrication of semiconductors (such as are used for the purpose of transistors), or in conjunction with the fabrication of superconductors (such as are used for the purpose magnets or detectors), or the like. There are virtually innumerable uses for an embodiment of the invention, all of which need not be detailed here.

Advantages

Embodiments of the invention can be cost effective and advantageous for at least the following reasons. Embodiments of the invention can improve the control of formation of a segregated phase domain structure within a chemical reaction product. Embodiments of the invention can improve the boundary properties of a plurality of domain structures within the segregated phase domain structure. Embodiments of the invention can improve the performance of chemical reaction products that include a segregated phase domain structure. Embodiments of the invention improve quality and/or reduce costs compared to previous approaches.

DEFINITIONS

The term layer is generically intended to mean films, coatings and thicker structures. The term coating is subgenerically intended to mean thin films, thick films and thicker structures. The term composition is generically intended to mean inorganic and organic substances such as, but not limited to, chemical reaction products and/or physical reaction products. The term selenide is intended to mean a material that includes the element selenium and does not include enough oxygen to precipitate a separate selenate base; oxygen may be present in selenide. The term tool is intended to mean a substrate intended for re-use or multiple use.

The term program and/or the phrase computer program are intended to mean a sequence of instructions designed for execution on a computer system (e.g., a program and/or computer program, may include a subroutine, a function, a procedure, an object method, an object implementation, an executable application, an applet, a servlet, a source code, an object code, a shared library/dynamic load library and/or other sequence of instructions designed for execution on a computer or computer system). The phrase radio frequency is intended to mean frequencies less than or equal to approximately 300 GHz as well as the infrared spectrum. Group numbers corresponding to columns within the periodic table of the elements use the "new Notation" convention as seen in the CRC Handbook of Chemistry and Physics, $81^{st}$ Edition (2000).

The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or.

Specifically, a condition A or B is satisfied by any one of the following: A is true (or present) and B is false (or not present), A is false (or not present) and B is true (or present), and both A and B are true (or present). The terms a or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub)method, (sub)process and/or (sub)routine for achieving the recited result.

The terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. The terms "consisting" (consists, consisted) and/or "composing" (composes, composed) are intended to mean closed language that does not leave the recited method, apparatus or composition to the inclusion of procedures, structure(s) and/or ingredient(s) other than those recited except for ancillaries, adjuncts and/or impurities ordinarily associated therewith. The recital of the term "essentially" along with the term "consisting" (consists, consisted) and/or "composing" (composes, composed), is intended to mean modified close language that leaves the recited method, apparatus and/or composition open only for the inclusion of unspecified procedure(s), structure(s) and/or ingredient(s) which do not materially affect the basic novel characteristics of the recited method, apparatus and/or composition.

Unless otherwise defined, all technical and scientific terms used herein have the same meaning as commonly understood by one of ordinary skill in the art to which this invention belongs. In case of conflict, the present specification, including definitions, will control.

CONCLUSION

The described embodiments and examples are illustrative only and not intended to be limiting. Although embodiments of the invention can be implemented separately, embodiments of the invention may be integrated into the system(s) with which they are associated. All the embodiments of the invention disclosed herein can be made and used without undue experimentation in light of the disclosure. Although the best mode of the invention contemplated by the inventor(s) is disclosed, embodiments of the invention are not limited thereto. Embodiments of the invention are not limited by theoretical statements (if any) recited herein. The individual steps of embodiments of the invention need not be performed in the disclosed manner, or combined in the disclosed sequences, but may be performed in any and all manner and/or combined in any and all sequences. The individual components of embodiments of the invention need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein.

It can be appreciated by those of ordinary skill in the art to which embodiments of the invention pertain that various substitutions, modifications, additions and/or rearrangements of the features of embodiments of the invention may be made without deviating from the spirit and/or scope of the underlying inventive concept. All the disclosed elements and features of each disclosed embodiment can be combined with, or substituted for, the disclosed elements and features of every other disclosed embodiment except where such elements or features are mutually exclusive. The spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES (1) B. J. Stanbery, "The intra-absorber junction (IAJ) model for the device physics of copper indium selenide-based photovoltaics," 0-7803-87074/05 IEEE, presented Jan. 5, 2005, pages 355-358.
(2) Y. Yan, R. Noufi, K. M. Jones, K. Ramanathan, M. M. Al-Jassim and B. J. Stanbery, "Chemical fluctuation-induced nanodomains in Cu(In,Ga)Se$_2$ films," Applied Physics Letters 87, 121904 American Institute of Physics, Sep. 12, 2005.
(3) Billy J. Stanbery, "Copper indium selenides and related materials for photovoltaic devices," 1040-8436/02 CRC Press, Inc., 2002, pages 73-117.
(4) B. J. Stanbery, S. Kincal, L. Kim, T. J. Anderson, O. D. Crisalle, S. P. Ahrenkiel and G. Lippold "Role of Sodium in the Control of Defect Structures in CIS," 0-7803-5772-8100 IEEE, 2000, pages 440-445.
(5) 20th European Photovoltaic Solar Energy Conference, 6-10 Jun. 2005, Barcelona, Spain, pages 1744-1747.

What is claimed is:

1. An apparatus, comprising:
a tool; and
a back surface contact coupled to the tool with a chemical reaction product there-between formed from a first precursor and a second precursor, the tool and the back surface contact movable relative to one another with the chemical reaction product remaining with one of said tool and back surface contact,
characterized in that, to control formation of a segregated phase domain structure within the chemical reaction product by controlling an amount of a constituent of a precursor that is present per unit surface area, at least one member selected from the group consisting of the tool and the back surface contact defines a substantially regularly periodically varying relief with respect to basal plan spatial location; wherein the ratio of the first precursor to second precursor varies in a pattern that correlates to the periodically varying relief.

2. The apparatus of claim 1 wherein the tool and the back surface contact are movable relative to one another to contact the first precursor located on the tool with a second precursor located on the back surface contact.

3. The apparatus of claim 1, further comprising a voltage source coupled to the tool and the back surface contact to generate an electric field between the tool and the back surface contact, the electric field substantially regularly spatially periodically varying in an electric field strength with respect to basal plane spatial location.

4. An apparatus, comprising:
a tool; and
a back surface contact coupled to the tool, the tool and the back surface contact movable relative to one another,
wherein the tool and the back surface contact are movable relative to one another to i) contact a first precursor located on the tool with a second precursor located on the back surface contact and ii) separate a chemical reaction product from at least one member selected from the group consisting of the tool and the back surface contact,
characterized in that, to control formation of a segregated phase domain structure within a chemical reaction product by controlling an amount of a constituent of a precursor that is present per unit surface area, at least one member selected from the group consisting of the tool and the back surface contact defines a substantially regularly periodically varying relief with respect to basal plane spatial location; wherein the ratio of the first precursor to second precursor varies in a pattern that correlates to the periodically varying relief.

5. The apparatus of claim 4, further comprising a voltage source coupled to the tool and the back surface contact to generate an electric field between the tool and the back surface contact, the electric field substantially regularly spatially periodically varying in electric field strength with respect to basal plane spatial location.

* * * * *